(12) United States Patent
Lee et al.

(10) Patent No.: US 12,146,734 B2
(45) Date of Patent: Nov. 19, 2024

(54) APPARATUS AND METHOD FOR DETERMINING THREE-DIMENSIONAL SHAPE OF OBJECT

(71) Applicant: KOH YOUNG TECHNOLOGY INC., Seoul (KR)

(72) Inventors: Chan Kwon Lee, Ansan-si (KR); Moon Young Jeon, Seongnam-si (KR); Deok Hwa Hong, Gwangmyeong-si (KR); Joong Ki Jeong, Gwangmyeong-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 244 days.

(21) Appl. No.: 17/623,498

(22) PCT Filed: Jun. 29, 2020

(86) PCT No.: PCT/KR2020/008462
§ 371 (c)(1),
(2) Date: Dec. 28, 2021

(87) PCT Pub. No.: WO2020/263055
PCT Pub. Date: Dec. 30, 2020

(65) Prior Publication Data
US 2022/0397390 A1    Dec. 15, 2022

(30) Foreign Application Priority Data
Jun. 28, 2019   (KR) .................. 10-2019-0077638

(51) Int. Cl.
*G01B 11/25*     (2006.01)
*G01B 11/24*     (2006.01)
(Continued)

(52) U.S. Cl.
CPC ........ *G01B 11/254* (2013.01); *G01B 11/2433* (2013.01); *G01B 11/2509* (2013.01);
(Continued)

(58) Field of Classification Search
CPC ............ G01B 11/2509; G01B 11/2527; G01B 11/2433; G01B 11/272; G01B 11/254; G01B 11/26; H01L 22/12
See application file for complete search history.

(56) References Cited

U.S. PATENT DOCUMENTS

| | | | |
|---|---|---|---|
| 7,548,324 B2 | 6/2009 | Lee et al. | |
| 8,064,069 B2 | 11/2011 | Wienand et al. | |

(Continued)

FOREIGN PATENT DOCUMENTS

| | | |
|---|---|---|
| CN | 1982841 | 6/2007 |
| CN | 101011860 | 8/2007 |

(Continued)

OTHER PUBLICATIONS

Korean Office Action with English translation for Korean Patent Application No. 10-2021-7042645, dated Jul. 3, 2023.
(Continued)

*Primary Examiner* — Sang H Nguyen
(74) *Attorney, Agent, or Firm* — KILE PARK REED & HOUTTEMAN PLLC

(57) ABSTRACT

The present disclosure proposes a detachable second apparatus coupled to a first apparatus that determines a first three-dimensional shape of an object and configured to determine an angle of an upper surface of the object. The second apparatus includes a first light source configured to sequentially irradiate first pattern lights having one phase range, a beam splitter and lenses configured to change optical paths of the first pattern lights so that a beam of light corresponding to a respective phase of the phase range
(Continued)

spreads, and arrives at each point of a partial region of the upper surface of the object, a communication interface, and a first processor configured to obtain first information on first reflected lights generated by reflecting the first pattern lights from the partial region and determine the angle of the upper surface with respect to the reference plane based on the first information.

11 Claims, 14 Drawing Sheets

(51) Int. Cl.
  *G01B 11/27* (2006.01)
  *H01L 21/66* (2006.01)
(52) U.S. Cl.
  CPC ........ *G01B 11/2527* (2013.01); *G01B 11/272* (2013.01); *H01L 22/12* (2013.01)

(56) References Cited

U.S. PATENT DOCUMENTS

| | | | |
|---|---|---|---|
| 8,224,066 | B2 | 7/2012 | Haeusler |
| 8,319,977 | B2 | 11/2012 | Koh et al. |
| 10,036,630 | B1 | 7/2018 | Sze et al. |
| 2007/0133011 | A1 | 6/2007 | Koh et al. |
| 2007/0211259 | A1 | 9/2007 | Jeon et al. |
| 2008/0317334 | A1 | 12/2008 | Hausler |
| 2009/0078620 | A1* | 3/2009 | Malek ............. G01N 21/95684 209/701 |
| 2009/0161086 | A1 | 6/2009 | Shibazaki |
| 2010/0201975 | A1 | 8/2010 | Hariyama et al. |
| 2010/0209832 | A1* | 8/2010 | Matsuda ............ G01B 9/02063 430/30 |
| 2010/0295941 | A1* | 11/2010 | Jeong ................... G01B 11/254 382/206 |
| 2011/0050893 | A1 | 3/2011 | Lee et al. |
| 2012/0069353 | A1 | 3/2012 | Yamada |
| 2013/0278723 | A1 | 10/2013 | Yu et al. |
| 2014/0022357 | A1* | 1/2014 | Yu ...................... G01B 11/2545 348/47 |
| 2014/0354804 | A1 | 12/2014 | Lee et al. |
| 2014/0354805 | A1 | 12/2014 | Lee et al. |
| 2016/0171748 | A1 | 6/2016 | Kohlbrenner et al. |
| 2017/0038197 | A1 | 2/2017 | Lee et al. |
| 2017/0108444 | A1 | 4/2017 | Otani et al. |
| 2018/0128603 | A1 | 5/2018 | Jeon et al. |
| 2018/0135975 | A1 | 5/2018 | Ohyama et al. |
| 2018/0156606 | A1 | 6/2018 | Jeon |
| 2018/0313643 | A1 | 11/2018 | Odaira et al. |
| 2019/0170507 | A1 | 6/2019 | Grauzinis et al. |
| 2019/0293413 | A1 | 9/2019 | Lee et al. |
| 2020/0141721 | A1 | 5/2020 | Lee et al. |
| 2020/0333135 | A1 | 10/2020 | Hong |

FOREIGN PATENT DOCUMENTS

| | | |
|---|---|---|
| CN | 101680783 | 3/2010 |
| CN | 102052907 | 5/2011 |
| CN | 105701793 | 6/2016 |
| CN | 107532891 | 1/2018 |
| CN | 108780208 | 11/2018 |
| CN | 108957910 | 12/2018 |
| JP | H10-223168 | 8/1998 |
| JP | 2003-17536 | 1/2003 |
| JP | 2015-203603 | 11/2015 |
| JP | 2016-206303 | 12/2016 |
| JP | 2017-122614 | 7/2017 |
| KR | 10-2011-0029057 | 3/2011 |
| KR | 10-2011-0086222 | 7/2011 |
| KR | 10-1659302 | 9/2016 |
| KR | 10-2016-0121716 | 10/2016 |
| WO | 2009/107981 | 9/2009 |
| WO | 2010/137637 | 12/2010 |

OTHER PUBLICATIONS

Korean Office Action with English translation for Korean Patent Application No. 10-2021-7042651, dated Jul. 3, 2023.
Korean Office Action with English translation for Korean Patent Application No. 10-2021-7042655, dated Jul. 3, 2023.
International Search Report, with English translation, corresponding to International Application No. PCT/KR2020/008463, dated Oct. 6, 2020.
Written Opinion, with English translation, corresponding to International Application No. PCT/KR2020/008463, dated Oct. 6, 2020.
International Search Report, with English translation, for International Application No. PCT/KR2020/008462, dated Sep. 29, 2020.
Written Opinion, with English translation, for International Application No. PCT/KR2020/008462, dated Sep. 29, 2020.
International Search Report, with English translation, corresponding to International Application No. PCT/KR2020/008461, dated Oct. 13, 2020.
Written Opinion, with English translation, corresponding to International Application No. PCT/KR2020/008461, dated Oct. 13, 2020.
Extended European Search Report corresponding to European Application No./Patent No. 20832687.6 dated Feb. 8, 2022.
Extended European Search Report corresponding to European Application No./Patent No. 20833192.6 dated Feb. 8, 2022.
Extended European Search Report corresponding to European Application No./Patent No. 20832482.2 dated Feb. 8, 2022.
Office Action from U.S. Appl. No. 17/623,508, dated Sep. 8, 2023.
Chinese Office Action, with English Translation, for Chinese Application No. 202080047588.X, dated Oct. 28, 2023.
Chinese Office Action, with English Translation, for Chinese Patent Application No. 202080047589.4, dated Feb. 29, 2024.
Korean Office Action, with English Translation, for Korean Patent Application No. 10-2021-7042645, dated Mar. 4, 2024.
Office Action from United States Patent Office for U.S. Appl. No. 17/623,497, dated Nov. 29, 2023.
Final Office Action from United States Patent Office for U.S. Appl. No. 17/623,508, dated Dec. 19, 2023.
Korean Office Action, with English Translation, for Korean Patent Application No. 10-2021-7042645, dated Jan. 8, 2024.
Korean Office Action, with English Translation, for Korean Patent Application No. 10-2021-7042651, dated Jan. 9, 2024.
Korean Office Action, with English Translation, for Korean Patent Application No. 10-2021-7042655, dated Jan. 9, 2024.
Final Office Action from United States Patent Office for U.S. Appl. No. 17/623,497, dated Mar. 15, 2024.
Chinese Office Action with English translation for Chinese Patent Application No. 202080047588.X, dated Mar. 30, 2024.
Chinese Office Action with English translation for Chinese Patent Application No. 202080047550.2, dated Mar. 29, 2024.
Korean Final Office Action with English translation for Korean Patent Application No. 10-2021-7042651, dated Apr. 3, 2024.
Korean Final Office Action with English translation for Korean Patent Application No. 10-2021-7042655, dated May 21, 2024.
Non Final Office Action for United States U.S. Appl. No. 17/623,497, dated Aug. 5, 2024.
Korean Office Action with English translation for Korean Patent Application No. 10-2024-7022302, dated Sep. 26, 2024.

* cited by examiner

| Tilt angle (left side) of object | | | | | | | | |
|---|---|---|---|---|---|---|---|---|
| Object tilt angle | I1 | I2 | I3 | I4 | Phase (deg) | A | B | B/A |
| 0 | 240.64 | 183.33 | 198.69 | 256.00 | 60.00 | 219.67 | 41.95 | 0.19 |
| 1 | 239.50 | 145.67 | 132.51 | 226.34 | 37.02 | 186.01 | 67.00 | 0.36 |
| 2 | 231.29 | 130.60 | 73.24 | 171.92 | 14.65 | 151.76 | 81.68 | 0.54 |
| 3 | 200.12 | 131.57 | 36.58 | 105.13 | -9.19 | 118.35 | 82.83 | 0.70 |
| 4 | 143.85 | 122.22 | 24.52 | 46.15 | -32.52 | 84.18 | 70.75 | 0.84 |
| 5 | 75.83 | 88.55 | 23.55 | 10.83 | -56.07 | 49.69 | 46.84 | 0.94 |
| 5.5 | 44.10 | 61.47 | 20.46 | 3.09 | -67.96 | 32.28 | 31.49 | 0.98 |
| 6 | 17.33 | 29.22 | 12.19 | 0.30 | -79.92 | 14.76 | 14.69 | 0.99 |

| Tilt angle (right side) of object | | | | | | | | |
|---|---|---|---|---|---|---|---|---|
| Object tilt angle | I1 | I2 | I3 | I4 | Phase (deg) | A | B | B/A |
| 0 | 240.64 | 183.33 | 198.69 | 256.00 | 60.00 | 219.67 | 41.95 | 0.19 |
| 1 | 194.19 | 119.51 | 177.82 | 252.50 | 82.99 | 186.01 | 67.00 | 0.36 |
| 2 | 129.77 | 74.00 | 174.74 | 230.52 | -73.97 | 152.26 | 81.42 | 0.53 |
| 3 | 66.01 | 54.15 | 170.68 | 182.55 | -50.82 | 118.35 | 82.83 | 0.70 |
| 4 | 21.42 | 51.53 | 150.78 | 116.84 | -26.79 | 85.14 | 72.46 | 0.85 |
| 5 | 2.96 | 46.48 | 96.41 | 52.90 | -3.93 | 49.69 | 46.84 | 0.94 |
| 5.5 | 1.09 | 36.64 | 63.47 | 27.93 | 7.95 | 32.28 | 31.49 | 0.98 |
| 6 | 0.95 | 19.77 | 28.57 | 9.76 | 19.92 | 14.76 | 14.69 | 0.99 |

APPARATUS AND METHOD FOR DETERMINING THREE-DIMENSIONAL SHAPE OF OBJECT

TECHNICAL FIELD

The present disclosure relates to a technique for determining a three-dimensional shape of an object.

BACKGROUND

In a process of mounting a device (e.g., a die) on a substrate, various inspections may be conducted as to whether the process has been properly performed. For example, it may be necessary to determine the three-dimensional shape of the device on the substrate, because failure to place the device at an appropriate position on the substrate may cause defects in the substrate subjected to the process. In the present disclosure, the device may refer to a component or a chipset used as an element in an electronic device such as an electric circuit or a semiconductor device. For example, the device may refer to a coil, a capacitor, a resistor, a transistor, a diode, an LED, or the like. In the present disclosure, the device is not limited to the aforementioned examples.

In determining the three-dimensional shape of a device (i.e., an object), it may be possible to inspect an angle of an upper surface of the device with respect to a substrate (i.e., a reference plane). The angle may be utilized to check whether there is no tilt between the device and the substrate. If the device is disposed or mounted so that the lower surface of the device is in close contact with the substrate, or if the device is disposed or mounted in a tilted state with respect to the substrate depending on the application state of a solder or solder ball applied to the substrate, it may cause a defect in the substrate.

In order to inspect the tilt of the upper surface of the device in determining the three-dimensional shape of the device, it may be possible to utilize a method of irradiating a light on the device and inspecting the tilt by using a position where the reflected light forms an image. However, in this method, when the device has a mirror surface, the reflection angle is changed greatly even if the device is tilted at a small angle. Therefore, a large space is required to measure the imaging position of the reflected light, which may make it difficult to downsize the inspection equipment. In addition, in order to inspect the tilt of the upper surface of the device, it may be possible to utilize a method of irradiating a structured light to the device, forming a diffraction pattern in the air above the device by the structured light, and inspecting the tilt through the use of a phase change of the diffraction pattern. However, this method may have a disadvantage in that a lot of noise is generated because the diffraction pattern is imaged in the air.

SUMMARY

Various embodiments of the present disclosure provide a technique for determining a three-dimensional shape of an object.

As one aspect of the present disclosure, there may be proposed an apparatus for determining a three-dimensional shape of an object. The apparatus according to one embodiment of the present disclosure may be a detachable second apparatus coupled to a first apparatus that determines a first three-dimensional shape of an object located on a reference plane and configured to determine an angle of an upper surface of the object with respect to the reference plane. The second apparatus may include: a first light source configured to sequentially irradiate one or more first pattern lights having one phase range; a beam splitter and one or more lenses configured to change optical paths of the one or more first pattern lights so that a beam of light corresponding to a respective phase of the phase range spreads, and arrives at each point of a partial region of the upper surface of the object; a communication interface configured to communicate with the first apparatus; and a first processor that is electrically connected to the first light source and the communication interface, and that is configured to obtain, from the first apparatus, first information on one or more first reflected lights generated by reflecting the one or more first pattern lights from the partial region and may be configured to determine the angle of the upper surface with respect to the reference plane based on the first information.

In one embodiment, the first information may include information indicating each light amount value of the one or more first reflected lights, and the first processor may be further configured to derive a phase value of each of the one or more first reflected lights from the each light amount value of the one or more first reflected lights and to determine the angle of the upper surface with respect to the reference plane based on the phase value.

In one embodiment, the second apparatus may further include: a memory configured to store reference information indicating a relationship between the angle of the upper surface with respect to the reference plane and the phase value of each of the one or more first reflected lights, wherein the first processor may be configured to determine the angle of the upper surface of the object with respect to the reference plane based on the phase value and the reference information.

In one embodiment, the first processor may be further configured to control the communication interface to transmit second information indicating the angle of the upper surface to the first apparatus, and the second information may be used for the first apparatus to determine a second three-dimensional shape of the object by correcting the upper surface of the object indicated by the first three-dimensional shape.

In one embodiment, the first processor may be further configured to control the communication interface to obtain third information indicating the first three-dimensional shape of the object from the first apparatus and may be configured to determine a second three-dimensional shape of the object by correcting the upper surface of the object indicated by the first three-dimensional shape based on the angle of the upper surface.

In one embodiment, the first light source may be further configured to irradiate a monochromatic light, and the beam splitter and the one or more lenses may be configured to change an optical path of the monochromatic light so that the monochromatic light arrives at the upper surface.

In one embodiment, the first processor may be further configured to control the communication interface to obtain fourth information indicating a reflectance of the upper surface from the first apparatus and may be configured to, when the reflectance of the upper surface is equal to or greater than a preset reference reflectance, control the first light source so as to sequentially irradiate the one or more first pattern lights.

In one embodiment, each of the one or more first pattern lights may be a pattern light generated by phase-shifting a pattern light having a pattern in a first direction or in a second direction perpendicular to the first direction by an integer multiple of a preset phase interval.

In one embodiment, the first apparatus may include: one or more second light sources configured to irradiate one or more second pattern lights to the object; an image sensor configured to capture the one or more first reflected lights and one or more second reflected lights generated by reflecting the one or more second pattern lights from the object; and a second processor configured to determine the first three-dimensional shape of the object based on the one or more first reflected lights and the one or more second reflected lights and configured to transmit third information indicating the first three-dimensional shape to the second apparatus.

As another aspect of the present disclosure, there may be proposed a method for determining a three-dimensional shape of an object. The method according to another aspect of the present disclosure may be a method for determining an angle of an upper surface of an object with respect to a reference plane, which is performed by a detachable second apparatus coupled to a first apparatus that determines a first three-dimensional shape of the object located on the reference plane. The method according to another aspect of the present disclosure may include: sequentially irradiating, by a first light source, one or more first pattern lights having one phase range; changing, by a beam splitter and one or more lenses, optical paths of the one or more first pattern lights so that a beam of light corresponding to a respective phase of the phase range spreads, and arrives at each point of a partial region of the upper surface of the object; obtaining, by a first processor, from the first apparatus, first information on one or more first reflected lights generated by reflecting the one or more first pattern lights from the partial region; and determining, by the first processor, the angle of the upper surface with respect to the reference plane based on the first information.

In one embodiment, the first information may include information indicating each light amount value of the one or more first reflected lights, and determining the angle of the upper surface may include deriving, by the first processor, a phase value of each of the one or more first reflected lights from the each light amount value of the one or more first reflected lights, and determining, by the first processor, the angle of the upper surface with respect to the reference plane based on the phase value.

In one embodiment, the method may further include: transmitting, by the first processor, second information indicating the angle of the upper surface to the first apparatus, wherein the second information may be used for the first apparatus to determine a second three-dimensional shape of the object by correcting the upper surface of the object indicated by the first three-dimensional shape.

In one embodiment, the method may further include: obtaining, by the first processor, third information indicating the first three-dimensional shape of the object from the first apparatus; and determining, by the first processor, a second three-dimensional shape of the object by correcting the upper surface of the object indicated by the first three-dimensional shape based on the angle of the upper surface.

DETAILED DESCRIPTION

Figure 1:
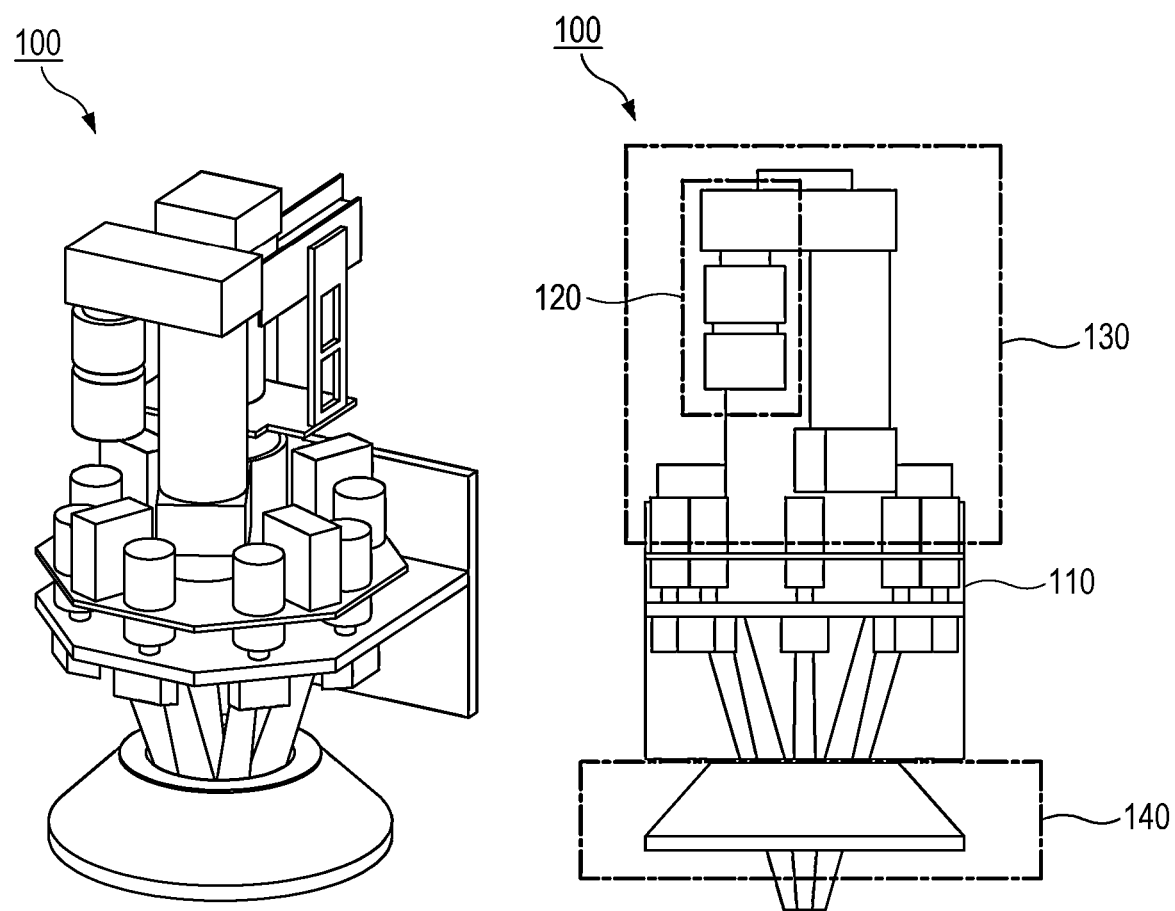
FIG. 1 is a diagram illustrating an apparatus 100 according to an embodiment of the present disclosure.

The various embodiments described herein are exemplified for the purpose of clearly describing the technical idea of the present disclosure, and are not intended to limit the technical idea of the present disclosure to specific embodiments. The technical idea of the present disclosure includes various modifications, equivalents, alternatives of each of the embodiments described in this document, and embodiments selectively combined from all or part of the respective embodiments. In addition, the scope of the technical idea of the present disclosure is not limited to various embodiments or detailed descriptions thereof presented below.

The terms used herein, including technical or scientific terms, may have meanings that are generally understood by a person having ordinary knowledge in the art to which the present disclosure pertains, unless otherwise specified.

As used herein, the expressions such as "include," "may include," "provided with," "may be provided with," "have," and "may have" mean the presence of subject features (e.g., functions, operations, components, etc.) and do not exclude the presence of other additional features. That is, such expressions should be understood as open-ended terms that imply the possibility of including other embodiments.

A singular expression can include meanings of plurality, unless otherwise mentioned, and the same is applied to a singular expression stated in the claims.

The terms "first", "second", etc. used herein are used to identify a plurality of components from one another, and are not intended to limit the order or importance of the relevant components.

As used herein, the expressions such as "A, B and C," "A, B or C," "A, B and/or C," "at least one of A, B and C," "at least one of A, B or C," "at least one of A, B and/or C," "at least one selected from A, B and C," "at least one selected from A, B or C," and "at least one selected from A, B and/or C" may mean each of the listed items or all possible combinations of the listed items. For example, the expression "at least one selected from A and B" may refer to (1) A, (2) at least one of A, (3) B, (4) at least one of B, (5) at least one of A and at least one of B, (6) at least one of A and B, (7) at least one of B and A, and (8) A and B.

The term "part" used herein may be a conception that comprehensively refers to software, or hardware components such as a field-programmable gate array (FPGA), an application specific integrated circuit (ASIC) and the like, and hardware components such as an optical element and the like. However, the term "part" is not limited to software and hardware. The term "part" may be configured to be stored in an addressable storage medium or may be configured to execute one or more processors. In one embodiment, the term "part" may include components, such as software components, object-oriented software components, class components, and task components, as well as processors, functions, attributes, procedures, subroutines, segments of program codes, drivers, firmware, micro-codes, circuits, data, databases, data structures, tables, arrays, and variables.

The expression "based on" used herein is used to describe one or more factors that influence a decision, an action of judgment or an operation described in a phrase or sentence including the relevant expression, and this expression does not exclude additional factors influencing the decision, the action of judgment or the operation.

As used herein, the expression that a certain component (e.g., a first component) is "connected" to another component (e.g., a second component) may mean that the certain component is not only connected or coupled to another component directly, but also connected or coupled via a new other component (e.g., a third component).

As used herein, the expression "configured to" may have a meaning such as "set to," "having the ability to," "modified to," "made to," "capable of," or the like depending on the context. The expression is not limited to the meaning of "specially designed for hardware." For example, a processor configured to perform a specific operation may mean a generic-purpose processor capable of performing a specific operation by executing software.

In order to describe various embodiments of the present disclosure, a Cartesian coordinate system having an X axis, a Y axis and a Z axis orthogonal to each other may be defined. As used herein, the expression such as "X-axis direction", "Y-axis direction" or "Z-axis direction" of the Cartesian coordinate system may refer to two directions toward which each axis of the Cartesian coordinate system extends, unless specifically defined otherwise in the corresponding description. In addition, the + sign in front of each axis direction may mean a positive direction, which is one of the two directions extending along the corresponding axis, and the − sign in front of each axis direction may mean a negative direction, which is the other of the two directions extending along the corresponding axis.

Direction indicators such as "upward", "upper" and the like used herein are based on the positive Z-axis direction in the accompanying drawings, unless otherwise defined in the description. Direction indicators such as "downward", "lower" and the like refer to the opposite direction thereof.

In the present disclosure, a substrate is a plate or container on which elements such as semiconductor chips or the like are mounted, and may serve as a path for transmitting electrical signals between elements. The substrate may be used for fabricating an integrated circuit or the like, and may be made of a material such as silicon or the like. For example, the substrate may be a printed circuit board (PCB), and may also be referred to as a wafer.

Hereinafter, various embodiments of the present disclosure will be described with reference to the accompanying drawings. In the accompanying drawings and the descriptions of the drawings, the same reference numerals may be assigned to the same or substantially equivalent elements. Furthermore, in the following description of various embodiments, the overlapping descriptions of the same or corresponding elements may be omitted. However, this does not mean that the elements are not included in the embodiments.

FIG. 1 is a diagram illustrating an apparatus 100 according to an embodiment of the present disclosure. The technique for determining a three-dimensional shape of an object according to the present disclosure may be implemented by apparatuses according to various embodiments. The apparatus 100 of the present disclosure may determine a three-dimensional shape of an object (e.g., a device) by using various inspection methods. In the present disclosure, the shape of the object may be a concept including both the shape of an object in a three-dimensional space and the color and texture of a surface of an object. In one embodiment, the apparatus 100 may perform an inspection using a pattern light and/or an inspection using coaxial deflectometry. In one embodiment, the apparatus 100 may further perform an inspection using an illumination light.

In this embodiment, the apparatus 100 may include a pattern light irradiation part 110, a deflectometry (DFM) part 120, a measurement part 130, and/or an illumination light irradiation part 140. In one embodiment, the illumination light irradiation part 140 may be omitted. The pattern light irradiation part 110 may irradiate a pattern light toward an object in order to perform an inspection using the pattern light. The DFM part 120 may irradiate a pattern light toward the object in order to perform an inspection using coaxial deflectometry. The measurement part 130 may capture the reflected light, which is irradiated by the pattern light irradiation part 110 and the DFM part 120 and reflected from the object, and may determine the three-dimensional shape of the object. The illumination light irradiation part 140 may irradiate an illumination light toward the object in order to perform an inspection using the illumination light. The illumination light may be reflected from the object, captured by the measurement part 130, and used to determine the three-dimensional shape of the object. The specific operations and inspection methods of the respective parts will be described later.

Figure 2:
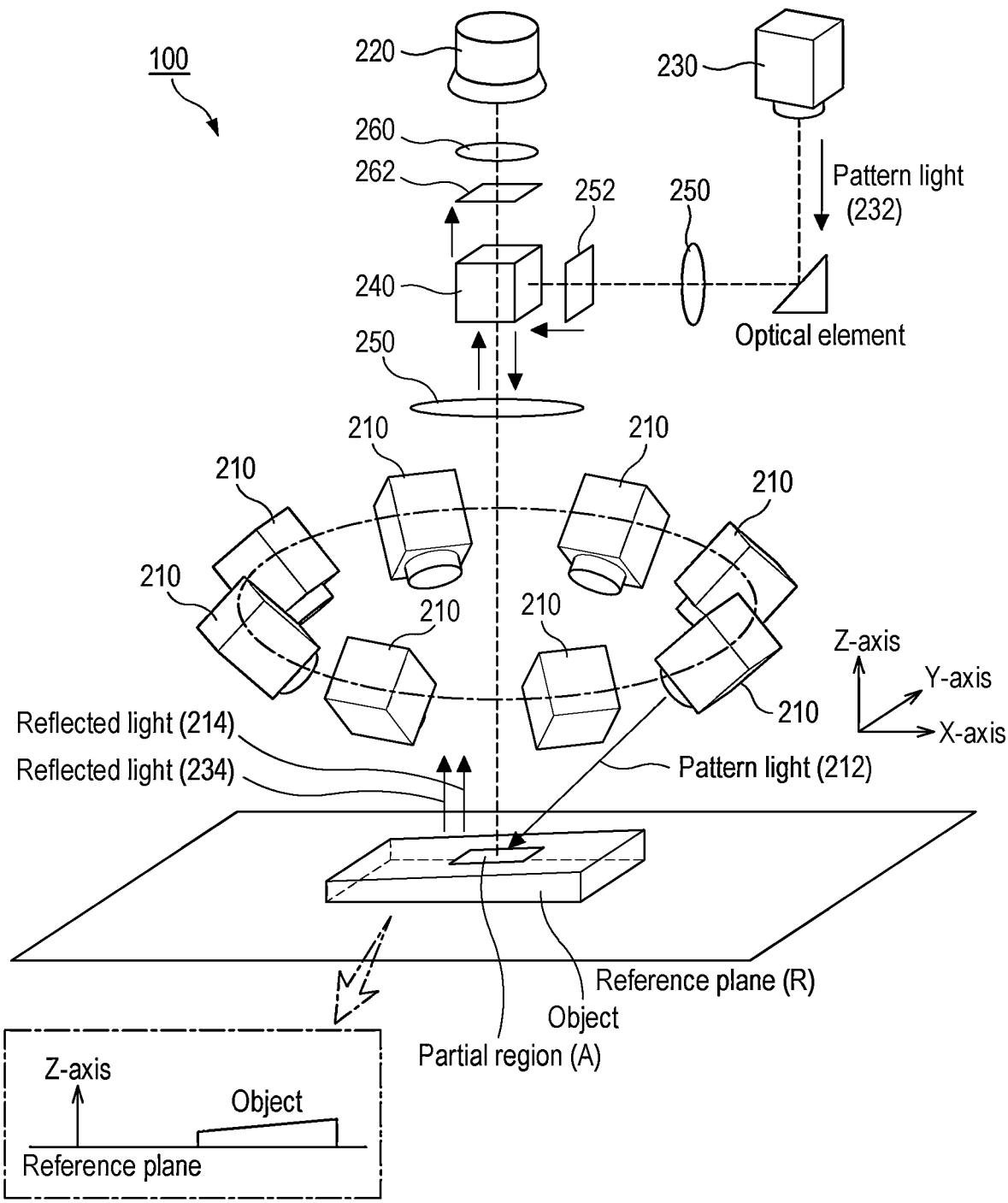
FIG. 2 is a diagram illustrating an operation process of the apparatus 100 according to an embodiment of the present disclosure.

FIG. 2 is a diagram illustrating an operation process of the apparatus 100 according to an embodiment of the present disclosure. The apparatus 100 according to the illustrated embodiment may perform an inspection method using a pattern light and/or an inspection method using coaxial deflectometry. The apparatus 100 may determine the three-dimensional shape of the object based on the inspection results. The determined three-dimensional shape may be used to determine the adequacy of the performed process.

The process in which the apparatus 100 performs an inspection using an illumination light will be described later as an additional embodiment.

In this embodiment, one or more pattern light sources 210 may irradiate one or more pattern lights 212 toward an object located on a reference plane R. The one or more pattern light sources 210 may belong to the pattern light irradiation part 110. The one or more pattern light sources 210 may be disposed above the reference plane R to irradiate the one or more pattern lights 212 toward the object along different optical axes. In one embodiment, the one or more pattern light sources 210 may be disposed at intervals from each other on an imaginary circumference positioned above the reference plane R. The one or more pattern lights 212 may be reflected from the object. Depending on the shape of the object, the phase of the pattern light 212 may be changed before and after reflection. That is, the reflected light 214 generated by the reflection of the pattern light 212 on the object may have a phase different from that of the corresponding pattern light 212.

An image sensor 220 may capture one or more reflected lights 214 generated by the reflection of the one or more pattern lights 212. The image sensor 220 may belong to the measurement part 130. In one embodiment, the image sensor 220 may be disposed to face the object vertically above the region on the reference plane R where the object is located.

The apparatus 100 may obtain information about the phase of each of the one or more reflected lights 214 and the phase of each of the one or more pattern lights 212. The apparatus 100 may determine a primary three-dimensional shape of the object based on a phase change of each of the one or more reflected lights 214 and each of the one or more pattern lights 212.

Meanwhile, the one or more pattern light sources 210 and the separately installed pattern light source 230 may sequentially irradiate one or more pattern lights 232. The pattern light source 230 may belong to the DFM part 120. The one or more pattern lights 232 may have the same one phase range (e.g., 0 to 7×π/4). In one embodiment, each of the one or more pattern lights 232 may be generated by phase shifting one pattern light within the above-described phase range by an integer multiple of a preset phase interval (e.g., π/2).

The one or more pattern lights 232 may travel toward a beam splitter 240 through a lens 250 and/or other optical elements (e.g., a mirror). In one embodiment, the pattern light 232 may travel toward the beam splitter 240 via an iris 252. The beam splitter 240 may reflect one or more pattern lights 232 toward the object. At this time, the beam splitter 240 and one or more lenses 250 may change optical paths of the one or more pattern lights 232 so that a light beam of light corresponding to each phase in the above-described phase range spreads, and arrives at each point of the partial region A of the upper surface of the object. That is, the optical path of the light corresponding to each phase of the pattern light 232 may be changed (adjusted) so that the light corresponding to one phase (e.g., 3×π/4) of the above-described phase range (e.g., 0 to 7×π/4) of the pattern light 232 arrives at each point on the plane corresponding to the aforementioned partial region A. The beam splitter 240 and the one or more lenses 250 may be disposed on the optical path of the pattern light 232 so that they can change the optical path. The beam splitter 240 and the one or more lenses 250 may belong to the DFM part 120.

Each of the one or more pattern lights 232 whose optical paths are changed (adjusted) may reach the object. Since the lights corresponding to the respective phases are irradiated over the entire partial region A of the upper surface of the object in a dispersed manner, the light corresponding to the average amount of the pattern lights 232 may arrive at each point of the partial region A. Each of the one or more pattern lights 232 arriving at the partial region A may be reflected from the partial region A. The light (hereinafter referred to as reflected light 234) generated by the reflection of the pattern light 232 may sequentially pass through the lens 250 and the beam splitter 240. In one embodiment, the reflected light 234 may pass through an iris 262 and, if necessary, may pass through an additionally disposed lens 260 to reach the image sensor 220. The image sensor 220 may capture each of the one or more reflected lights 234.

When the partial region A of the upper surface of the object is tilted with respect to the reference plane R, only a portion of the light reflected from the partial region A may pass through the iris 262 and may be inputted to the image sensor 220. That is, the iris 252 passes the pattern light 232 toward the beam splitter 240, and the iris 262 passes the reflected light 234 traveling from the partial region A to the image sensor 220. Accordingly, the light amount value of the reflected light 234 captured by the image sensor 220 may be determined according to the light amount of the light passing through the iris 252, reflected by the partial region A and passing through the iris 262. At this time, the light captured by the image sensor 220 may be the light corresponding to the partial phase range (e.g., 3×π/4 to 5×π/4) of the above-described phase range (e.g., 0 to 7×π/4) of the initially irradiated pattern light 232. That is, the amount of the light passing through the iris 262 and captured by the image sensor 220 may vary according to the degree at which the upper surface of the object or the partial region A is tilted with respect to the reference plane R. By using this principle, it is possible to derive the degree of tilt of the reflective surface based on the amount of captured reflected light, which may be referred to as deflectometry in the present disclosure. In particular, as in the illustrated embodiment, when the pattern light 232 incident on the object and the reflected light 234 reflected from the object travel along substantially the same optical axis, the deflectometry may be referred to as coaxial deflectometry. The specific principle of the deflectometry will be described later.

According to the deflectometry, the apparatus 100 may determine the angle of the upper surface of the object with respect to the reference plane R based on the each light amount value of the one or more reflected lights 234. The apparatus 100 may determine a secondary three-dimensional shape by correcting the previously determined primary three-dimensional shape by using the determined angle of the upper surface. That is, the apparatus 100 may correct the upper surface indicated by the primary three-dimensional shape by using the information on the angle of the upper surface measured according to the deflectometry and may derive a new corrected three-dimensional shape, i.e., a secondary three-dimensional shape. In one embodiment, the correction may be performed by a method of overriding the angle of the upper surface indicated by the primary three-dimensional shape with the angle of the upper surface derived according to the deflectometry. In one embodiment, the correction may be performed by determining an average value of the angle of the upper surface indicated by the primary three-dimensional shape and the angle of the upper surface derived according to the deflectometry as an angle of the upper surface indicated by the secondary three-dimensional shape. The secondary three-dimensional shape is the final three-dimensional shape of the object, and may be used to determine the adequacy of a process such as a mounting process or the like.

Figure 3:
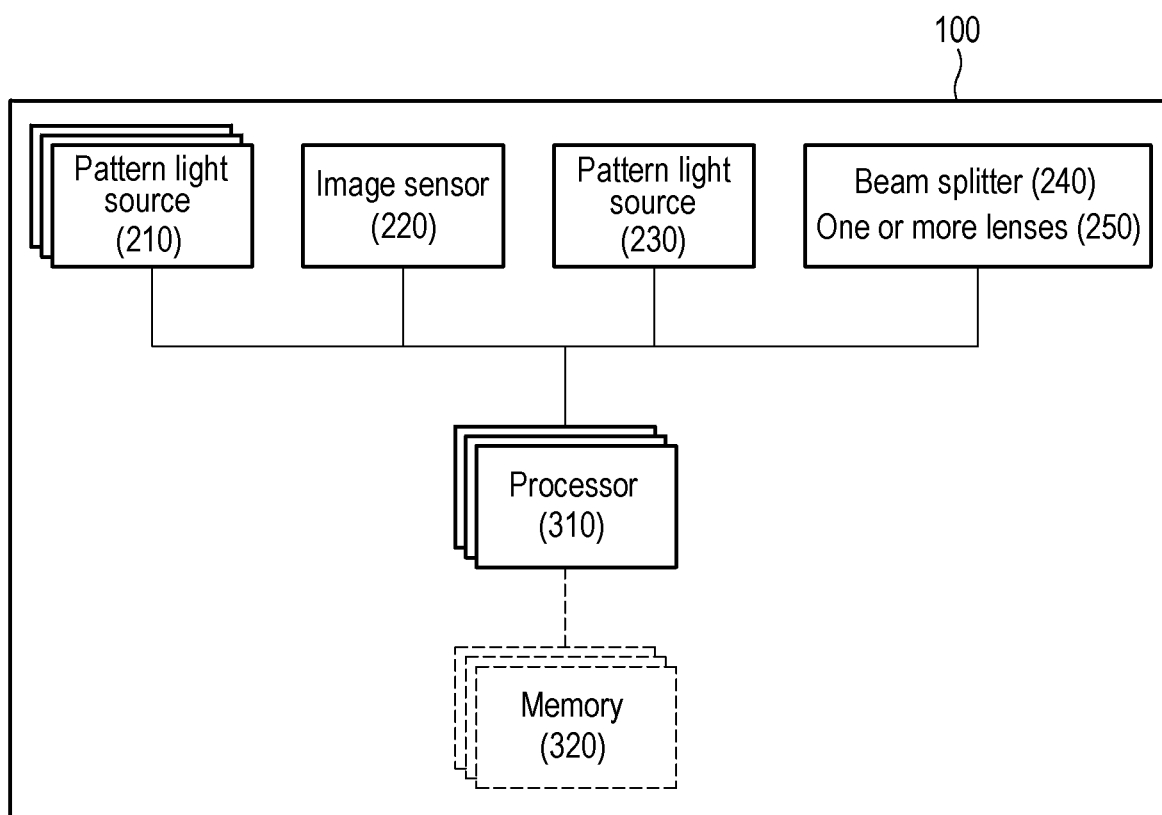
FIG. 3 is a block diagram illustrating the apparatus 100 according to an embodiment of the present disclosure.

FIG. 3 is a block diagram of the apparatus 100 according to an embodiment of the present disclosure. In this embodiment, the apparatus 100 may include one or more pattern light sources 210, an image sensor 220, a pattern light source 230, a beam splitter 240, one or more lenses 250, one or more processors 310 and/or one or more memories 320. In one embodiment, at least one of these components of the apparatus 100 may be omitted, or other components may be added to the apparatus 100. In one embodiment, additionally or alternatively, some components may be integrally implemented, or may be implemented as a singular entity or plural entities. In the present disclosure, one or more processors may be referred to as a processor. The term "processor" may mean one processor or a set of two or more processors, unless the context clearly indicates otherwise. In the present disclosure, one or more memories may be referred to as a memory. The term "memory" may mean one memory or a set of two or more memories, unless the context clearly indicates otherwise. In one embodiment, at least some of the internal and external components of the apparatus 100 may be connected to each other through a bus, a general-purpose input/output (GPIO) device, a serial peripheral interface (SPI), a mobile industry processor interface (MIPI), or the like to transmit and receive data and/or signals.

Each of the one or more pattern light sources 210 may irradiate one or more pattern lights 212 as described above. The pattern light sources 210 may generate the pattern lights 212 in various ways. For example, the patterns of the pattern lights 212 may be formed by a digital method or an analog method. Examples of the digital method include a liquid crystal transmission method using an LCD (Liquid Crystal Display), a liquid crystal reflection method using an LCoS (Liquid Crystal on Silicon), and a mirror reflection method using a DMD (Digital Micromirror Device) or DLP (Digital Light Processing). Examples of the analog method include a method of forming a pattern by using a pattern such as a periodic pattern, a gradient pattern, a lattice pattern or the like. As described above, the one or more pattern light sources 210 may be disposed above the reference plane R to irradiate pattern lights 212 along different optical axes. In one embodiment, four pattern light sources 210 may be arranged at intervals of about 90 degrees on an imaginary circumference (4-way). In one embodiment, eight pattern light sources 210 may be arranged at intervals of about 45 degrees on an imaginary circumference (8-way). In one embodiment, the pattern light sources 210 may sequentially irradiate one or more pattern lights 212 phase-shifted to four buckets. In one embodiment, the one or more pattern lights 212 may be generated by phase-shifting one pattern light by an integer multiple of a preset phase interval (e.g., $\pi/2$). For example, if eight pattern light sources 210 are used and the one or more phase-shifted pattern lights 212 are sequentially irradiated in four buckets, 32 (8×4) pattern lights 212 in total may be irradiated to the object. Accordingly, a total of 32 images are captured, and information on the 32 phase changes may be used to determine the primary three-dimensional shape of the object.

The image sensor 220 may capture one or more reflected lights 214 and the reflected light 234 as described above. For example, the image sensor 220 may be implemented as a charge coupled device (CCD) or a complementary metal oxide semiconductor (CMOS) sensor.

Similar to the pattern light sources 210, the pattern light source 230 may generate and irradiate pattern lights 232 in various ways. In one embodiment, the pattern light source 230 may sequentially irradiate one or more pattern lights 232 phase-shifted to four buckets. In one embodiment, if the pattern lights 232 obtained by phase-shifting the pattern light formed in one direction (hereinafter referred to as a w-axis direction) to four buckets and the pattern lights 232 obtained by phase-shifting the pattern light formed in a direction (hereinafter referred to as a v-axis direction) perpendicular to the w-axis direction to four buckets are used, a total of 8 (4+4) pattern lights 232 may be sequentially irradiated. Accordingly, a total of eight images may be captured and used to determine the angle of the upper surface of the object.

The beam splitter 240, the one or more lenses 250 and/or other optical elements described above may be variously implemented by optical elements according to methods known in the art of the present disclosure. In one embodiment, the beam splitter 240 and/or the one or more lenses 250 may be arranged to change the optical paths of the aforementioned pattern lights 232 for deflectometry. Alternatively, in one embodiment, the processor 310 may adjust the positions, arrangements and related parameters of the beam splitter 240 and/or the one or more lenses 250 so that the beam splitter 240 and/or the one or more lenses 250 can change the optical paths of the aforementioned pattern lights 232. In one embodiment, the apparatus 100 may also include the iris 252 and the iris 262 described above.

The processor 310 may control at least one component of the apparatus 100 connected to the processor 310 by driving software (e.g., instructions, programs, etc.). In addition, the processor 310 may perform various operations such as calculation, treatment, data generation, processing, and the like related to the present disclosure. In addition, the processor 310 may load data or the like from the memory 320 or may store data or the like in the memory 320. In one embodiment, the processor 310 may determine a primary three-dimensional of the object based on the phase changes of the one or more reflected lights 214 from the one or more pattern lights 212. In addition, the processor 310 may determine an angle of the upper surface of the object with respect to the reference plane R based on the light amount values of the one or more reflected lights 234 according to deflectometry. The processor 310 may determine a second (final) three-dimensional shape by correcting the primary three-dimensional shape using the determined angle of the upper surface.

The memory 320 may store various kinds of data. The data stored in the memory 320 is acquired, processed, or used by at least one component of the apparatus 100, and may include software (e.g., instructions, programs, etc.). The memory 320 may include a volatile memory and/or a non-volatile memory. In the present disclosure, the instructions or programs are software stored in the memory 320, and may include an operating system and an application for controlling the resources of the apparatus 100, and/or middleware for providing various functions to the application so that the application can utilize the resources of the apparatus 100. In one embodiment, the memory 320 may store instructions that cause the processor 310 to perform calculation when executed by the processor 310.

In one embodiment, the apparatus 100 may further include a communication interface (not shown). The communication interface may perform wireless or wired communication between the apparatus 100 and a server, or between the apparatus 100 and another apparatus. For example, the communication interface may perform wireless communication according to a method such as eMBB (enhanced Mobile Broadband), URLLC (Ultra Reliable Low-Latency Communications), MMTC (Massive Machine Type Communications), LTE (long-term evolution), LTE-A (LTE Advance), UMTS (Universal Mobile Telecommunications System), GSM (Global System for Mobile communications), CDMA (code division multiple access), WCDMA (wideband CDMA), WiBro (Wireless Broadband), WiFi (wireless fidelity), Bluetooth, NFC (near field communication), GPS sensor 12 (Global Positioning System), GNSS (global navigation satellite system) or the like. For example, the communication interface may perform wired communication according to a method such as USB (Universal Serial Bus), HDMI (High Definition Multimedia Interface), RS-232 (Recommended Standard-232), POTS (Plain Old Telephone Service) or the like. In one embodiment, the processor 310 may control the communication interface to obtain information necessary to implement the technique according to the present disclosure from a server. The information obtained from the server may be stored in the memory 320. In one embodiment, the information obtained from the server may include information about a substrate or an object, information about the reference plane R, and reference information to be described later.

Figure 4:
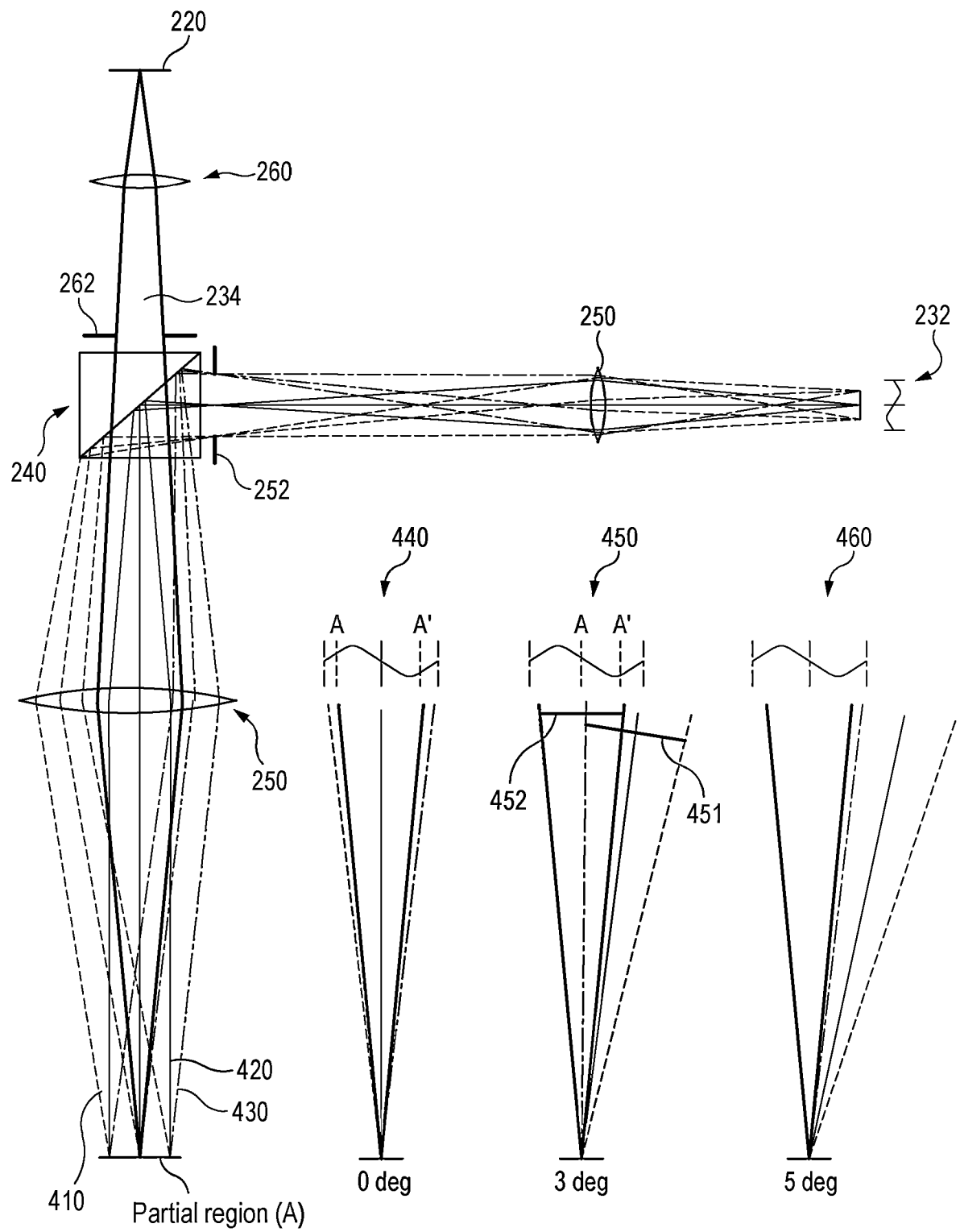
FIG. 4 is a diagram illustrating a process in which the pattern lights are irradiated to the object according to an embodiment of the present disclosure.

FIGS. 4 to 8 are diagrams for explaining the principle of the above-described coaxial deflectometry. FIG. 4 is a diagram illustrating a process in which the pattern lights 232 are irradiated to the object according to an embodiment of the present disclosure. As described above, in each of the one or more pattern lights 232, the light path of each of the one or more pattern lights 232 may be changed so that a beam of light corresponding to each phase in the corresponding phase range (e.g., 0 to 7×π/4) spreads, and arrives at each point of a partial region A of the upper surface of the object. Hereinafter, one pattern light 232 will be described as a reference.

As described above, the pattern light source 230 may irradiate pattern lights 232 corresponding to one phase range. The optical paths 410, 420 and 430 of the lights corresponding to arbitrary three phases within the aforementioned phase range are shown. Each light may be irradiated to the partial region A of the upper surface of the object through the one or more lenses 250, the iris 252 and/or the beam splitter 240. As described above, each beam of light corresponding to one phase among the phase range may be irradiated over the entire partial region A in a dispersed manner. That is, the light 410 corresponding to one phase may be irradiated to arrive at each point of the surface corresponding to the partial region A. The lights 420 and 430 corresponding to other phases of the pattern light 232 may also be irradiated to the object in the same manner. Therefore, all the lights corresponding to the respective phases in the above-described phase range may be irradiated to one point of the partial region A on the object. For example, in the illustrated embodiment, all the lights 410, 420, and 430 reach each point of the partial region A on the object. Accordingly, the lights having an average light amount of the pattern lights 232 corresponding to the above-described phase range may be irradiated to the entire partial region A of the object.

The reflected light 234 generated by reflecting the pattern light 232 from the partial region A may pass through the iris 262 and may be inputted to the image sensor 220. As described above, if the upper surface of the object is tilted with respect to the reference plane R, only a portion of the reflected light 234 can pass through the iris 262. A portion of the reflected light 234 passing through the iris 262 may correspond to a part of the phase range of the pattern light 232 irradiated from the pattern light source 230. As a result, an average amount of the lights corresponding to the partial phase range may be captured by the image sensor 220.

In the illustrated example 440, the angle of the upper surface of the object with respect to the reference plane R may be 0 degrees. In this case, most of the light reflected from one point of the partial region A may pass through the iris 262 and may be captured by the image sensor 220. That is, in the example 440, the light corresponding to the phase section indicated by A and A' may be reflected from the partial region A, may pass through the iris 262, and may be inputted to the image sensor 220.

In the illustrated example 450, the object may be tilted at an angle of 3 degrees with respect to the reference plane R. In this case, only a portion of the light reflected from one point of the partial region A may pass through the iris 262 and may be captured by the image sensor 220. Specifically, the phase range of the pattern light 232 passed through the iris 252 may be the section indicated by the straight line 451, whereas the phase range of the reflected light 234 passed through the iris 262 may be the section indicated by the straight line 452. Accordingly, the light having an optical path passing through both the iris 252 and the iris 262 may be the light corresponding to the phase section indicated by A and A'. In this case, the light amount of the reflected light 234 obtained by the image sensor 220 may be an average light amount of the lights corresponding to the phase section indicated by A and A'.

In the illustrated example 460, the object may be tilted at an angle of 5 degrees with respect to the reference plane R. In this case, most of the light reflected from one point in the partial region A may not pass through the iris 262. Accordingly, the image sensor 220 may not be able to capture the reflected light 234. The angles of the upper surface of the object in the above-described examples 440, 450 and 460 may be exemplary values selected for description.

That is, the amount of light inputted to the image sensor 220 through both the iris 252 and the iris 262 may be changed depending on the angle of the upper surface of the object. Using the varying amount of reflected light 234, the apparatus 100 may determine (derive) the angle of the upper surface of the object.

Figure 5:
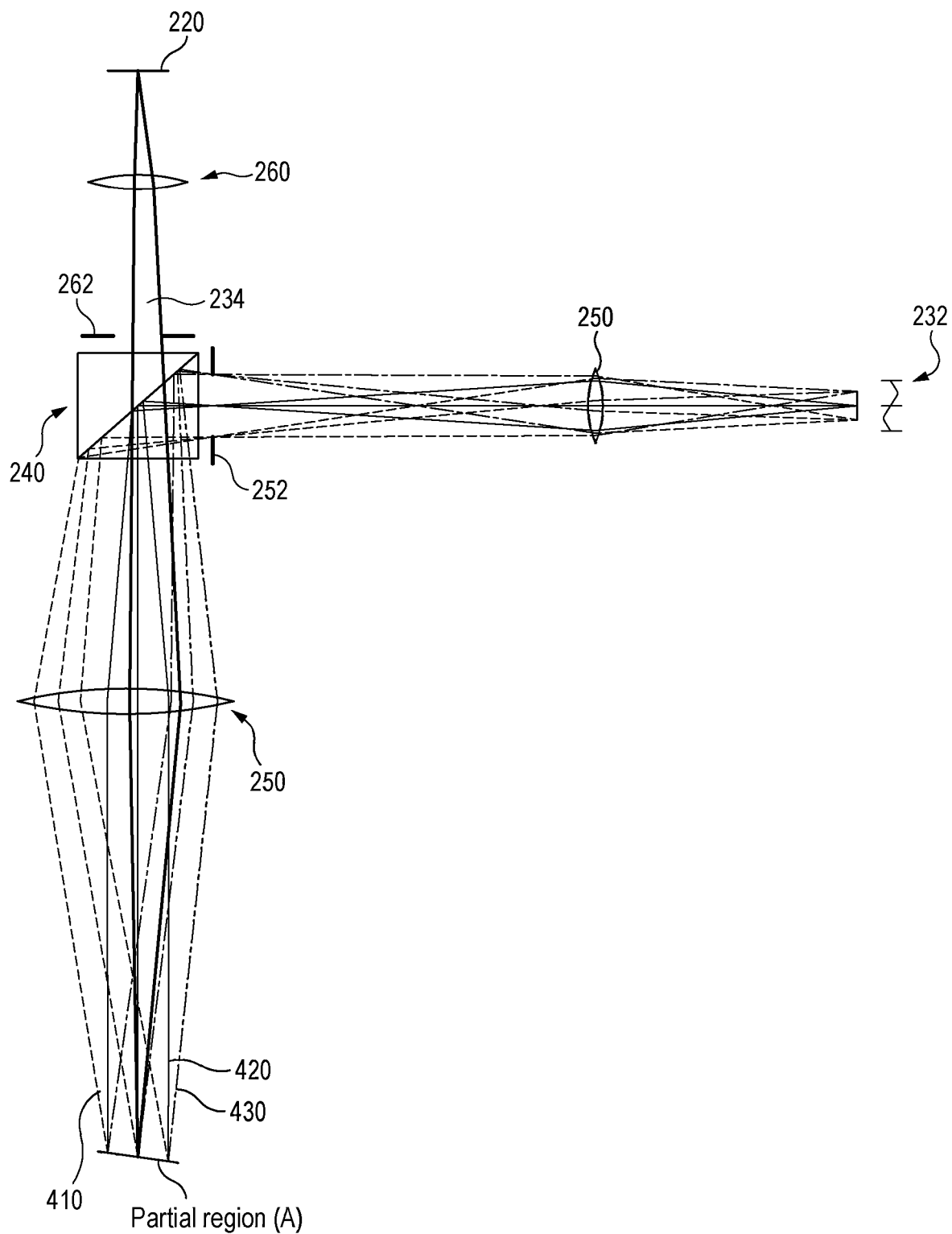
FIG. 5 is a diagram illustrating a process in which the reflected lights pass through the iris according to an embodiment of the present disclosure.

FIG. 5 is a diagram illustrating a process in which the reflected lights 234 pass through the iris 262 according to an embodiment of the present disclosure. The illustrated example may represent a case in which the upper surface of the object is tilted at a predetermined angle with respect to the reference plane R, as in the above-described example 450.

Similarly, the pattern lights 232 having one phase range may be irradiated from the pattern light sources 230 and may be irradiated to the partial region A of the upper surface of the object in a dispersed manner. Since the upper surface of the object is tilted, only a portion of the reflected lights 234 may pass through the iris 262 and may be inputted to the image sensor 220. Among the reflected lights of the lights 410, 420 and 430 incident on the partial region A, only the reflected light whose optical path extends within the range indicated by the thick solid line may pass through the iris 262 and may be inputted to the image sensor 220.

A portion of the reflected lights inputted to the image sensor 220 may be the light corresponding to a part of the above-described phase range of the pattern lights 232 and reflected from the partial region A on the object. As a result, the amount of reflected lights 234 obtained by the image sensor 220 may be an average amount of the lights corresponding to the part of the above-described phase range of the pattern lights 232.

Figure 6:
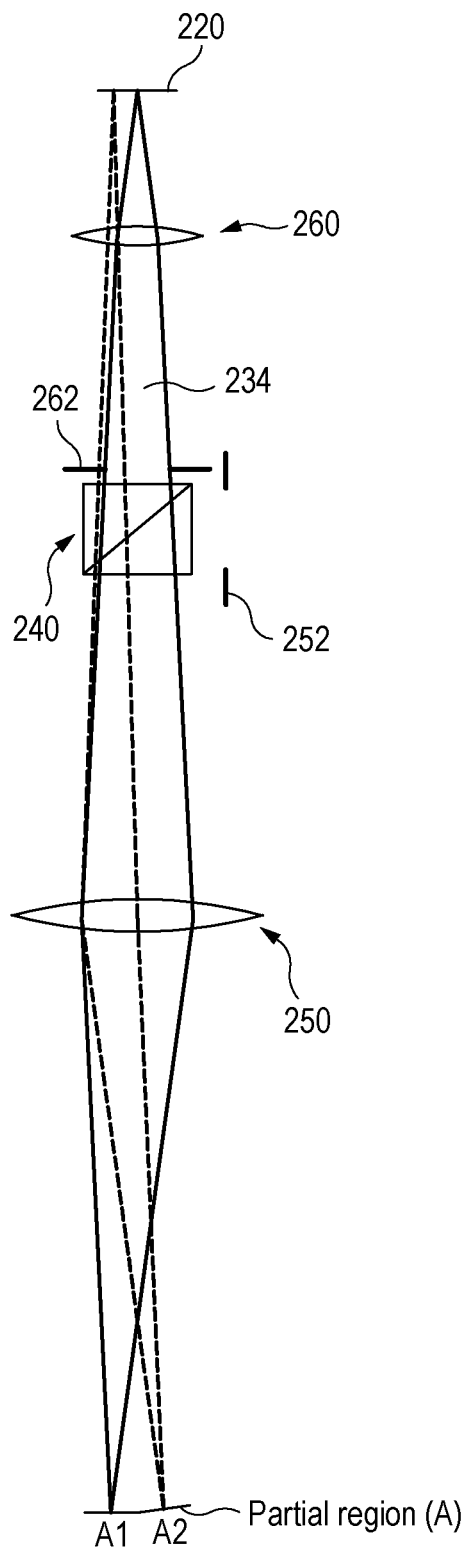
FIG. 6 is a diagram illustrating a process in which the reflected lights pass through the iris according to an embodiment of the present disclosure.

FIG. 6 is a diagram illustrating a process in which the reflected lights 234 pass through the iris 262 according to an embodiment of the present disclosure. In the illustrated embodiment, a portion A1 of the partial region A of the upper surface of the object may not be tilted with respect to the reference plane R, and the other portion A2 may be tilted with respect to the reference plane R.

The light reflected from the non-tilted portion A1 may pass through the iris 262 and may be inputted to the corresponding portion of the image sensor 220 (thick solid line), as in the above-described example 440. The corresponding portion of the image sensor 220 may receive the average light amount of the lights irradiated from the pattern light source 230 and corresponding to the above-described phase range. Only a part of the light reflected from the tilted portion A2 may pass through the iris 262 and may be inputted to the image sensor 220 (thick dotted line), as in the above-described example 450. The corresponding portion of the image sensor 220 may receive the average light amount of only the lights irradiated from the pattern light source 230 and corresponding to a part of the above-described phase range. A tilt value at each portion of the partial region A on the object may be obtained by using the average light amount values inputted for the respective portions (pixels) of the image sensor 220.

Figures 7, 8:
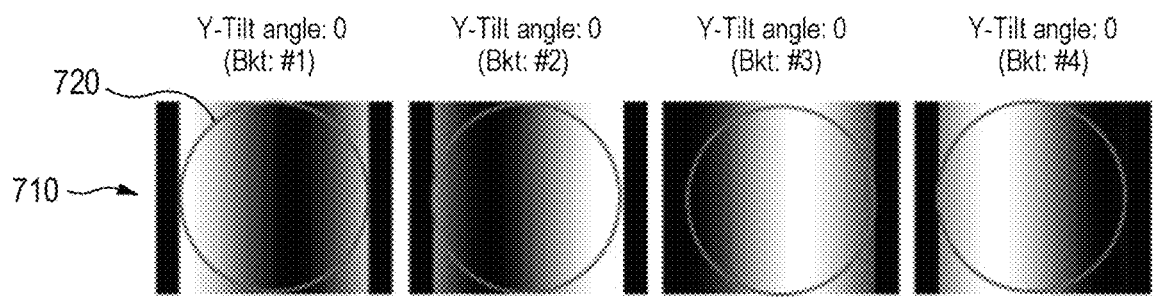
FIG. 7 is a view showing the states in the iris of the pattern lights irradiated from the pattern light sources according to an embodiment of the present disclosure.
FIG. 8 is a diagram illustrating reference information according to an embodiment of the present disclosure.

FIG. 7 is a view showing the states in the iris 252 of the pattern lights 232 irradiated from the pattern light source 230 according to an embodiment of the present disclosure. A pattern of one pattern light 232 may have a period. When the phase corresponding to one period is assumed to be $2\pi$, the pattern of the pattern light may gradually become bright during the period from 0 to $\pi/2$, the pattern of the pattern light may gradually become dark during the period from $\pi/2$ to $3\times\pi/2$, and the pattern of the pattern light may gradually become bright again during the period from $3\times\pi/2$ to $2\pi$. As described above, the pattern light source 230 may irradiate pattern lights 232 having one phase range. This phase range may be appropriately set as needed. In one embodiment, the phase range may be set so as not to be one period of a pattern or a multiple of one period of the pattern. That is, the phase range may be set to a range other than the phase range corresponding to 0, $2\pi$, $4\pi$, ..., and $2n\pi$. This is because the lights corresponding to the average light amount of the pattern lights 232 are irradiated to the partial region A and, therefore, the lights corresponding to the respective phases of the pattern lights may cancel each other when the pattern lights in the phase range corresponding to one period or a multiple of one period are used. Furthermore, in one embodiment, the phase range may be set to be larger than a phase range corresponding to a half period of the pattern lights and smaller than a phase range corresponding to one period of the pattern lights. In addition, in one embodiment, the phase range may be set to be larger than the phase range corresponding to an (N+½) period of the pattern lights (where N is a natural number) and smaller than the phase range corresponding to an (N+1) period of the pattern lights. Such a phase range may be set when it is necessary to increase the total amount of pattern lights in order to facilitate the measurement of the reflected light.

Each of the one or more pattern lights 232 may be generated by phase-shifting one pattern light corresponding to the above-described phase range by an integer multiple of a preset phase interval (e.g., $\pi/2$). In one embodiment, the above-described phase interval may be set to a value greater than 0 and less than $\pi$. The one or more pattern lights 232 may be referred to as a 0-th bucket, a first bucket, a second bucket and a third bucket, i.e., four buckets. The respective pattern lights 232 generated by the phase shift may also have the above-described phase range $\alpha$. That is, for example, the respective pattern lights 232 may have a phase range of 0 to $\alpha$, a phase range of $\pi/2$ to $\pi/2+\alpha$, a phase range of $\pi$ to $\pi+\alpha$, and a phase range of $3\times\pi/2$ to $3\times\pi/2+\alpha$. The pattern lights 232 for the respective buckets may appear like the illustrated patterns 710 in the iris 252. In one embodiment, the region of the pattern light passing through the iris 252 may be a circular region 20. Accordingly, the light corresponding to the circular region in the rectangular pattern light irradiated from the pattern light source 230 may be irradiated to the object. In one embodiment, the apparatus 100 may determine the angle of the upper surface of the object by using only one pattern light 232. However, if the angle of the upper surface of the object is measured by using a plurality of pattern lights, it is possible to reduce various measurement errors such as an error caused by the material of the upper surface of the object, and the like.

The total light amount value of the pattern light 232 in the pattern light source 230 may be calculated as represented by the following equation.

$$I_{LCOS} = \int_\alpha^\beta (I_0 + I^\circ \ast \sin(\varphi)) d\varphi \quad \text{[Equation 1]}$$

In Equation 1, $I^\circ$ may be a constant that determines the amplitude of the sinusoidal graph of the pattern of the pattern light 232, and $I_o$ may be a constant that determines the offset of the sinusoidal graph of the pattern of the pattern light 232. The total light amount value $I_{LCOS}$ may be derived by integrating the pattern light 232 irradiated from the pattern light source 230 in the phase range ($\alpha$ to $\beta$).

FIG. 8 is a diagram illustrating reference information according to an embodiment of the present disclosure. As described above, the apparatus 100 may determine the angle of the upper surface of the object with respect to the reference plane R based on the light amount value of each of the one or more reflected lights 234. The apparatus 100 may derive the phase value of the reflected light 234 from the light amount value of the reflected light 234, and may determine the angle of the upper surface of the object by comparing the derived phase value with the reference information.

In the present embodiment, the processor 310 may derive a phase value of each of the one or more reflected lights 234 from the light amount value of each of the one or more reflected lights 234. When one pattern light 232 is reflected from the partial region A of the object and captured by the image sensor 220, the light amount value $I_n$ of the reflected light may be represented by the following equation.

$$I_n = A + B \cos(\varphi(x,y) - \alpha(t)) \quad \text{[Equation 2]}$$

In Equation 2, A and B may correspond to $I_o$ and $I^\circ$, respectively. $\varphi(x, y)$ may be a phase value of the reflected light reflected from one point (x, y) of the partial region A. $\alpha(t)$ may represent the above-described phase shift amount of the pattern light 232. For example, the light amount values $I_1$, $I_2$, $I_3$ and $I_4$ of the reflected lights generated by the plurality of pattern lights 232 (i.e., four buckets) phase-shifted at a phase interval of $\pi/2$ and reflected from the partial region A may be represented by the following equation 3. Equation 3 may be arranged by substituting each phase shift amount $\alpha(t)$ in Equation 2.

$$I_1 = A + B \cos(\varphi) \quad \alpha(t) = 0$$

$$I_2 = A - B \sin(\varphi) \quad \alpha(t) = \pi/2$$

$I_3 = A - B\cos(\varphi)\ \alpha(t) = \pi$ $I_4 = A + B\sin(T)\ \alpha(t) = 3\pi/2$ [Equation 3]

As described above, the image sensor 220 may capture the light having an average amount of lights corresponding to a part of the phase range of the pattern lights 232. In this regard, the light corresponding to the part of the phase range may vary depending on the angle of the upper surface of the object and/or the bucket of the irradiated pattern light 232. That is, even for the object tilted at the same angle, the configuration of the light corresponding to the above-described part of the phase range may vary according to how much the irradiated pattern light 232 is phase-shifted. The amounts of the reflected lights for the respective buckets may be the aforementioned $I_1$, $I_2$, $I_3$ and $I_4$.

The light amount values $I_1$, $I_2$, $I_3$ and $I_4$ of the respective reflected lights are values that can be measured by the image sensor 220. A, B and p may be derived by using the above four equations for $I_1$, $I_2$, $I_3$ and $I_4$. Since there are three unknowns, at least three equations are required, and therefore, the measurement through the use of three or more different pattern lights 232 may have to be performed at least three times. Accordingly, by rearranging Equation 3, the phase value p of the reflected light can be derived by the following equation.

$\varphi = \tan^{-1}(I_4 - I_2/I_1 - I_3)$ [Equation 4]

Through this process, the phase values of the one or more reflected lights 234 may be derived from the light amount values of the one or more reflected lights 234, respectively. This derivation process may be performed by the processor 310.

In one embodiment, the memory 320 of the apparatus 100 may further store the reference information. The reference information may indicate a relationship between the angles of the upper surface of the object with respect to the reference plane R and the phase values of the reflected lights 234. The numerical values indicated by the illustrated reference information are exemplary values, and the values of the reference information may be changed according to embodiments. The relationship between the phase values indicated by the reference information and the tilt angles of the object may be stored in the memory 220 as a database through measurement and calculation.

As shown, the reference information may include information about the tilt angles of the object, the light amount values $I_1$, $I_2$, $I_3$ and $I_4$ of the reflected lights for the respective buckets measured for the respective angles, and the phase values of the reflected lights derived through the measured light amount values. For example, when the tilt angle of the object is 1 degree, the measured light amount values $I_1$, $I_2$, $I_3$ and $I_4$ of the reflected lights for the respective buckets may be 239.50, 145.67, 132.41 and 226.34, respectively. The phase value derived from these light amount values may be 37.02 degrees. In one embodiment, the reference information may also include the values A and B in Equation 3 described above.

The processor 310 may determine the angle of the upper surface of the object with respect to the reference plane R based on the phase value of the reflected light 234 and the reference information. The processor 310 may determine a corrected second (final) three-dimensional shape by correcting the upper surface indicated by the primary three-dimensional shape through the use of the determined angle of the upper surface.

Figure 9:
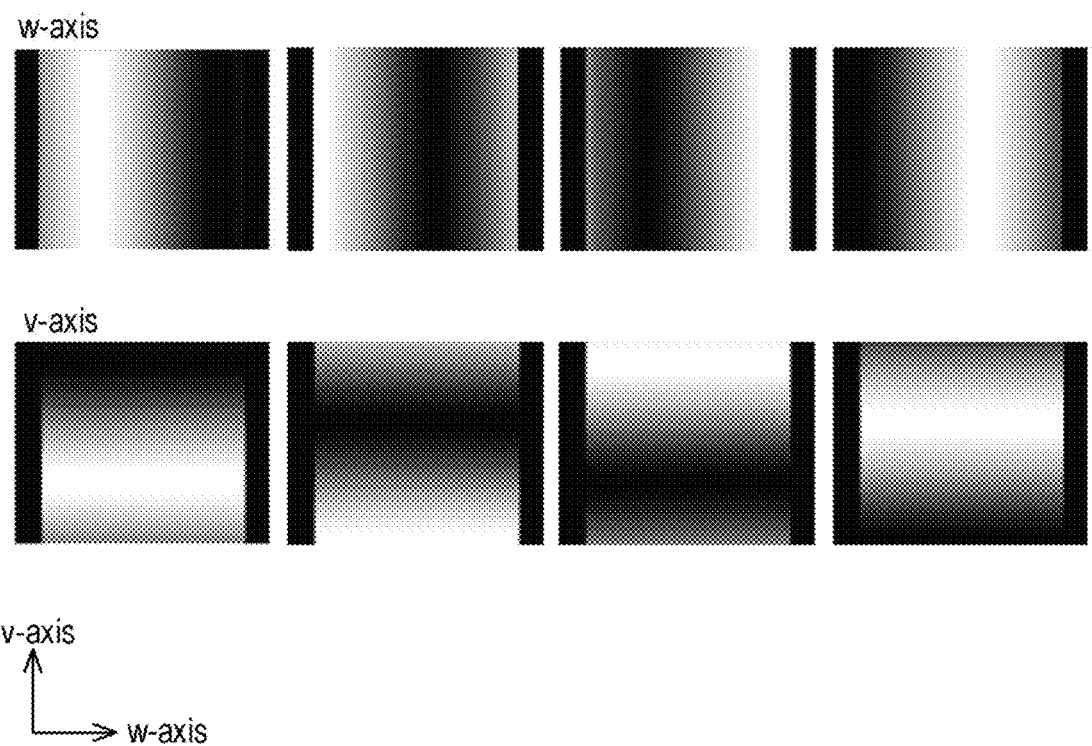
FIG. 9 is a diagram illustrating the orientations of the patterns of the pattern lights according to an embodiment of the present disclosure.

FIG. 9 is a diagram illustrating the orientations of the patterns of the pattern lights 212 and 232 according to an embodiment of the present disclosure. In one embodiment, the pattern light sources 210 and 230 may generate pattern lights 212 and 232 having patterns on a rectangular plane. When the axis corresponding to one side of the rectangular plane is assumed to be a w-axis and the axis corresponding to the other side and perpendicular to the w-axis is assumed to be a v-axis, the patterns of the pattern lights 212 and 232 may be formed in the w-axis direction or the v-axis direction. In one embodiment, each of the one or more pattern lights 212 and 232 may have a pattern in the w-axis direction or in the v-axis direction perpendicular to the w-axis. In one embodiment, the orientations of the patterns of the pattern lights 212 and 232 may be set differently for the respective buckets. In one embodiment, an error in determining the three-dimensional shape of the object may be reduced by using a plurality of patterns formed in the respective directions.

Figure 10:
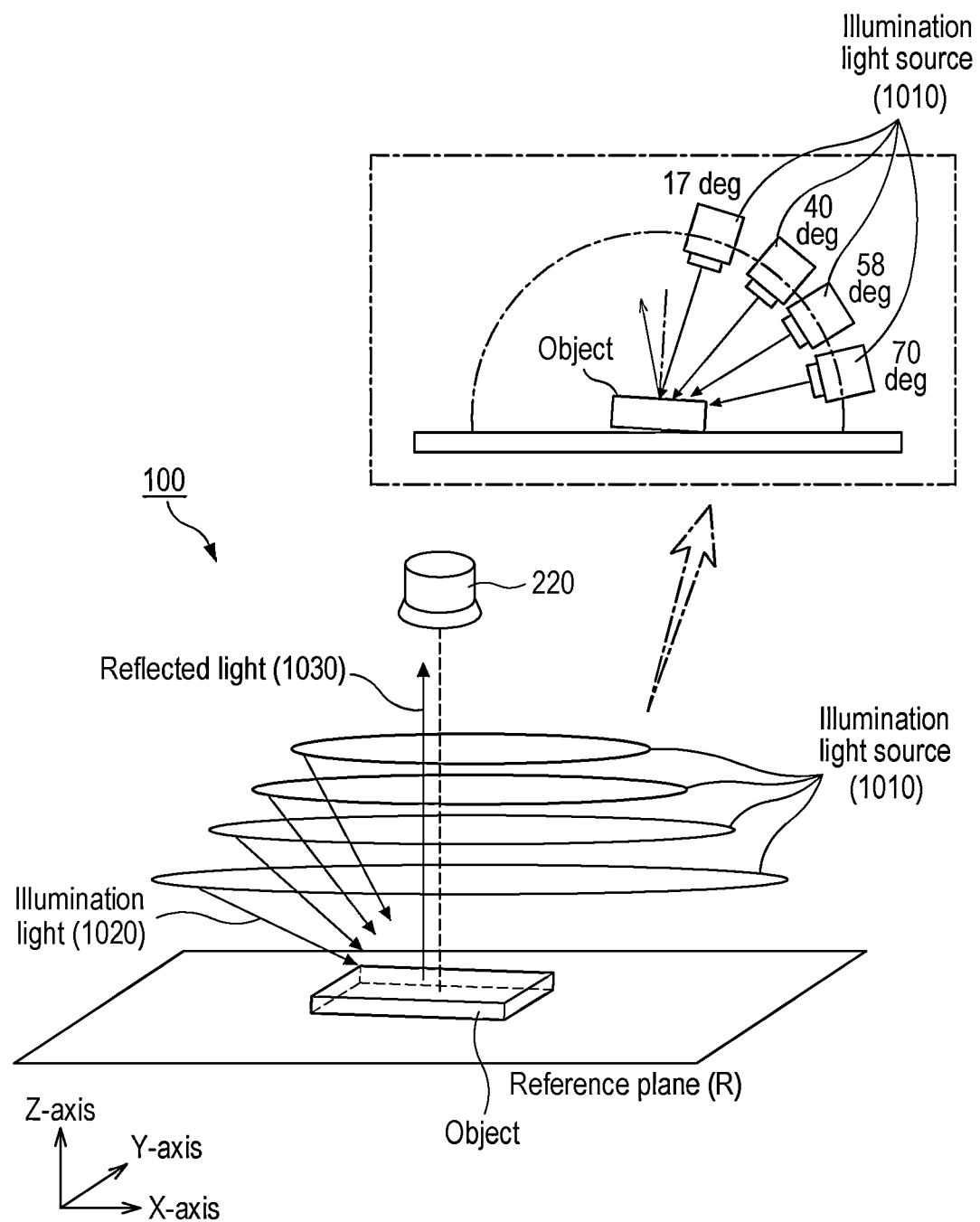
FIG. 10 is a diagram illustrating an inspection process using the illumination light of the apparatus 100 according to an embodiment of the present disclosure.

FIG. 10 is a diagram illustrating an inspection process using illumination lights of the apparatus 100 according to an embodiment of the present disclosure. Some of the components of the apparatus 100 described above are arbitrarily omitted. In one embodiment, the apparatus 100 may further perform an inspection using illumination lights. The apparatus 100 may determine the primary three-dimensional shape of the object by additionally reflecting the inspection result obtained through the use of the illumination lights in addition to the inspection result obtained through the use of the pattern lights described above.

In this embodiment, the apparatus 100 may further include one or more illumination light sources 1010. The illumination light sources 1010 may belong to the illumination light irradiation part 140. Each of the illumination light sources 1010 may irradiate the illumination light 1020 toward the object located on the reference plane R. In one embodiment, one illumination light source 1010 may be implemented in such a form as to include a plurality of illumination light sources (e.g., LED lights) arranged to be spaced apart from each other at predetermined intervals on a circumference. The corresponding circumference may be disposed parallel to the reference plane R. In one embodiment, one illumination light source 1010 may be implemented as one illumination light source having a columnar shape. The respective illumination light sources 1010 may be disposed above the reference plane R or the object. The respective illumination light sources 1010 may be arranged to irradiate the illumination lights to the object along optical axes tilted at one or more angles (e.g., 17 degrees, 40 degrees, 58 degrees, 70 degrees, etc.) with respect to the reference plane R. In one embodiment, a total of four illumination light sources 1010 may be used as shown. In the present disclosure, the illumination lights may be lights according to one or more wavelengths. In one embodiment, the illumination lights may be a red light, a green light or a blue light. The illumination light sources 1010 may be implemented as RGB light sources, and may include a red light source, a green light source and/or a blue light source. In one embodiment, the illumination light sources 1010 may simultaneously irradiate at least two lights, and may simultaneously irradiate red, green and blue lights to generate a white light.

The illumination lights 1020 may be reflected from the object. The image sensor 220 may capture the lights (hereinafter referred to as reflected lights 1030) formed by the reflection of the illumination lights 1020. In this case, the amount of lights captured by the image sensor 220 may vary depending on the angles at which the illumination lights 1020 are irradiated to the object and the angles at which the reflected lights 1030 are reflected from the object. The shape of the object may be determined based on the light amount values changed before and after reflection.

That is, the processor 310 may obtain a change in the light amount of each of the one or more reflected lights 1030 from each of the illumination lights 1020 according to one or more wavelengths. The processor 310 may determine the above-described primary three-dimensional shape of the object based on the change in the light amount. In one embodiment, the processor 310 may determine the primary three-dimensional shape of the object by both the inspection result obtained using the pattern lights and the inspection result obtained using the illumination lights. In this case, the processor 310 may determine the primary three-dimensional shape of the object based on the phase change of each of the one or more reflected lights 214 from each of the one or more pattern lights 212 and the change in the light amount of each of the one or more reflected lights 1030 from each of the illumination lights 1020 according to one or more wavelengths. Thereafter, as described above, the processor 310 may determine a second (final) three-dimensional shape of the object by correcting the primary three-dimensional shape through the use of the determined angle of the upper surface. In one embodiment, if four illumination light sources 1010 are used to sequentially irradiate a red light, a green light and a blue light, a total of 12 (4×3) illumination lights may be irradiated to the object. Accordingly, a total of 12 reflected lights may be captured by the image sensor 220 and may be used to determine the primary three-dimensional shape of the object.

Figure 11:
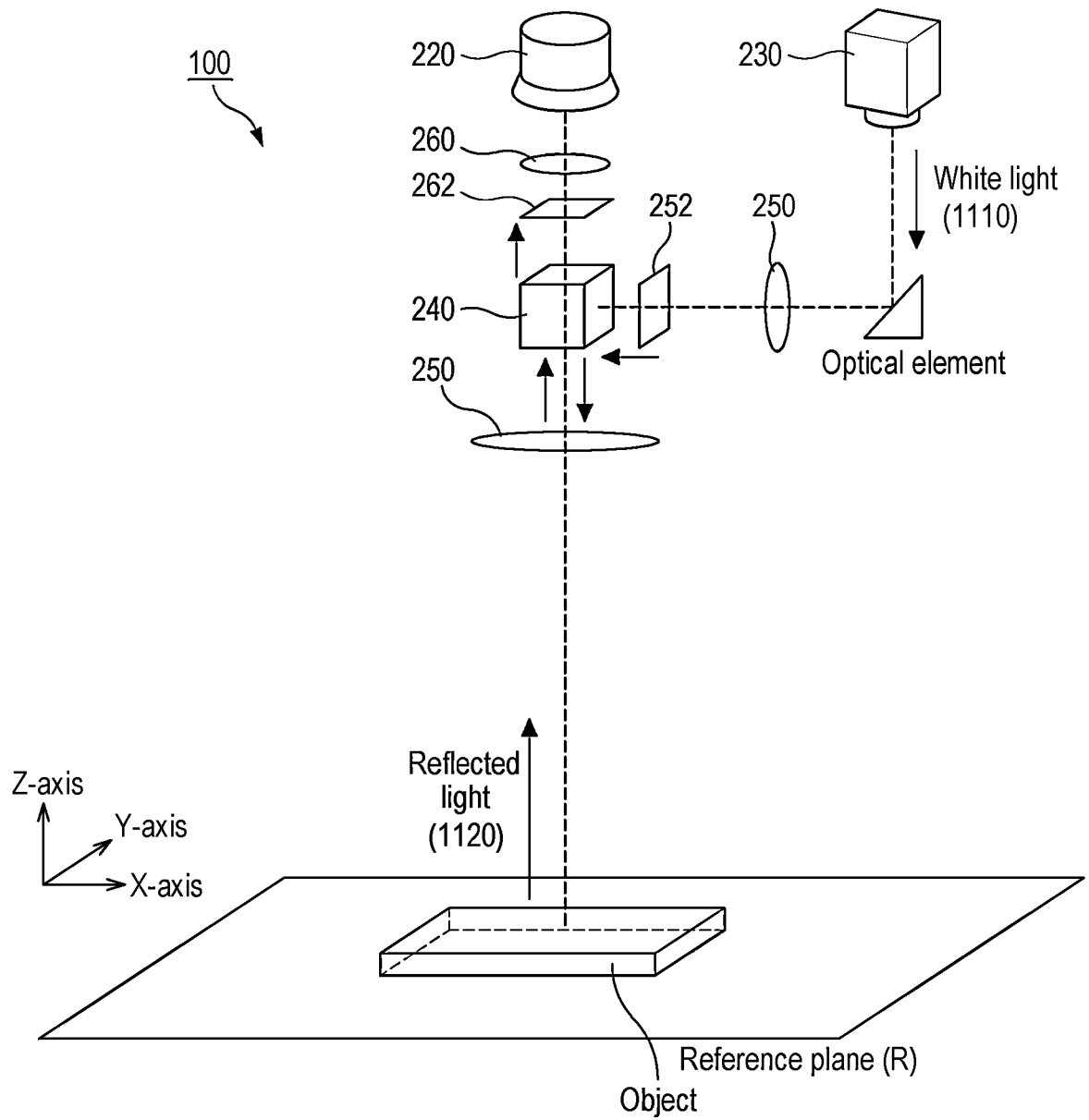
FIG. 11 is a diagram illustrating a process of additionally irradiating a white light from a pattern light source according to an embodiment of the present disclosure.

FIG. 11 is a diagram illustrating a process in which the pattern light source 230 additionally irradiates a white light 1110 according to an embodiment of the present disclosure. Some of the components of the apparatus 100 described above are arbitrarily omitted. In one embodiment, the pattern light source 230 of the apparatus 100 may further irradiate the white light 1110. A more accurate primary three-dimensional shape of the object may be determined using the information about the reflected light 1120 of the white light 1110.

In the present embodiment, the pattern light source 230 may irradiate at least one monochromatic light such as a red light, a green light, a blue light and a white light. For example, the pattern light source 230 may irradiate a white light 1120. By controlling an element that generates a pattern in the pattern light source 230, a white illumination light without a pattern may be irradiated from the pattern light source 230. The white light 1120 may travel along an optical path similar to that of the above-described pattern light 232. The beam splitter 240 and the one or more lenses 250 may change the optical path of the white light 1110 so that the white light 1110 arrives at the upper surface of the object. For example, the white light 1110 may travel to the beam splitter 240 via the lens 250, the iris 252 and other optical elements. The beam splitter 240 may change the optical path of the white light 1110 so that the white light 1110 faces the upper surface of the object.

The white light 1110 may be reflected from the upper surface of the object. Depending on the shape of the object, the light amount of the white light 1110 may be changed before and after reflection. That is, the light amount of the white light 1110 and the light amount of the reflected light 1120 may be different from each other. The reflected light 1120 may travel toward the beam splitter 240, and the beam splitter 240 may pass the reflected light 1120 to the image sensor 220. The image sensor 220 may capture the reflected light 1120.

The processor 310 may determine the shape of the object based on the value of the light amount changed before and after reflection. That is, the processor 310 may obtain a change in the light amount of the reflected light 1120 from the white light 1110 and may determine the primary three-dimensional shape of the object based on the change in the light amount. In one embodiment, the processor 310 may determine the primary three-dimensional shape of the object by using both the inspection result obtained using the pattern light and the inspection result obtained using the white light. In this case, the processor 310 may determine the primary three-dimensional shape of the object based on the phase change of each of the one or more reflected lights 214 from each of the one or more pattern lights 212 and the change in the light amount of the reflected light 1120 from the white light 1110. Thereafter, as described above, the processor 310 may determine a second (final) three-dimensional shape of the object by correcting the primary three-dimensional shape using the determined angle of the upper surface.

In one embodiment, the apparatus 100 may determine the secondary three-dimensional shape by performing the inspection using the coaxial deflectometry only when a preset criterion is satisfied. Otherwise, the apparatus 100 may determine only the primary three-dimensional shape. This is to reduce the time required for the inspection process by performing an additional inspection on the upper surface of the object only when necessary. In one embodiment, when the reflectance of the upper surface of the object is equal to or greater than a preset reference reflectance, the apparatus 100 may additionally perform an inspection on the object using the coaxial deflectometry. If the upper surface of the object is a mirror surface or a surface which is mirror-finished after a reflow process, it may be difficult to accurately measure the shape of the upper surface of the object only by the inspection using the illumination lights or the pattern lights. Accordingly, when it is determined that the upper surface of the object is a mirror surface (i.e., when the reflectance is equal to or greater than a preset reference reflectance), the apparatus 100 may additionally perform an inspection using the coaxial deflectometry.

Specifically, the processor 310 may obtain light amount information of the white light 1110 from the pattern light source 230 and may obtain light amount information of the reflected light 1120 from the image sensor 220. The processor 310 may derive the reflectance of the upper surface of the object based on the change in the light amount of the reflected light 1120 from the white light 1110. When the derived reflectance of the upper surface is equal to or greater than the preset reference reflectance, the processor 310 may control the pattern light source 230 to sequentially irradiate the one or more pattern lights 232 described above. In one embodiment, the information about the preset reference reflectance may be stored in the memory 320.

In one embodiment, the apparatus 100 may first perform an inspection using pattern lights and then perform an inspection using deflectometry. That is, the reflected light 214 may be captured by first irradiating the pattern light 212, and then the reflected light 234 may be captured by irradiating the pattern light 232. In one embodiment, the inspection using the illumination lights may be performed prior to the inspection using the deflectometry.

As one embodiment, the apparatus 100 may determine a three-dimensional shape by imaging the reference plane R, the object, or both the reference plane R and the object using pattern lights, and then may derive the angle of the upper surface of the object using deflectometry.

That is, when the upper surface of the object is a mirror surface, it is possible to check the reference surface R using the pattern lights. However, it may be difficult to accurately restore the three-dimensional shape of the object. Therefore, the information on the upper surface of the object relative to the reference plane R and the information on the three-dimensional shape of the object may be accurately derived based on the information on the angle of the upper surface of the object derived using the deflectometry.

Figure 12:
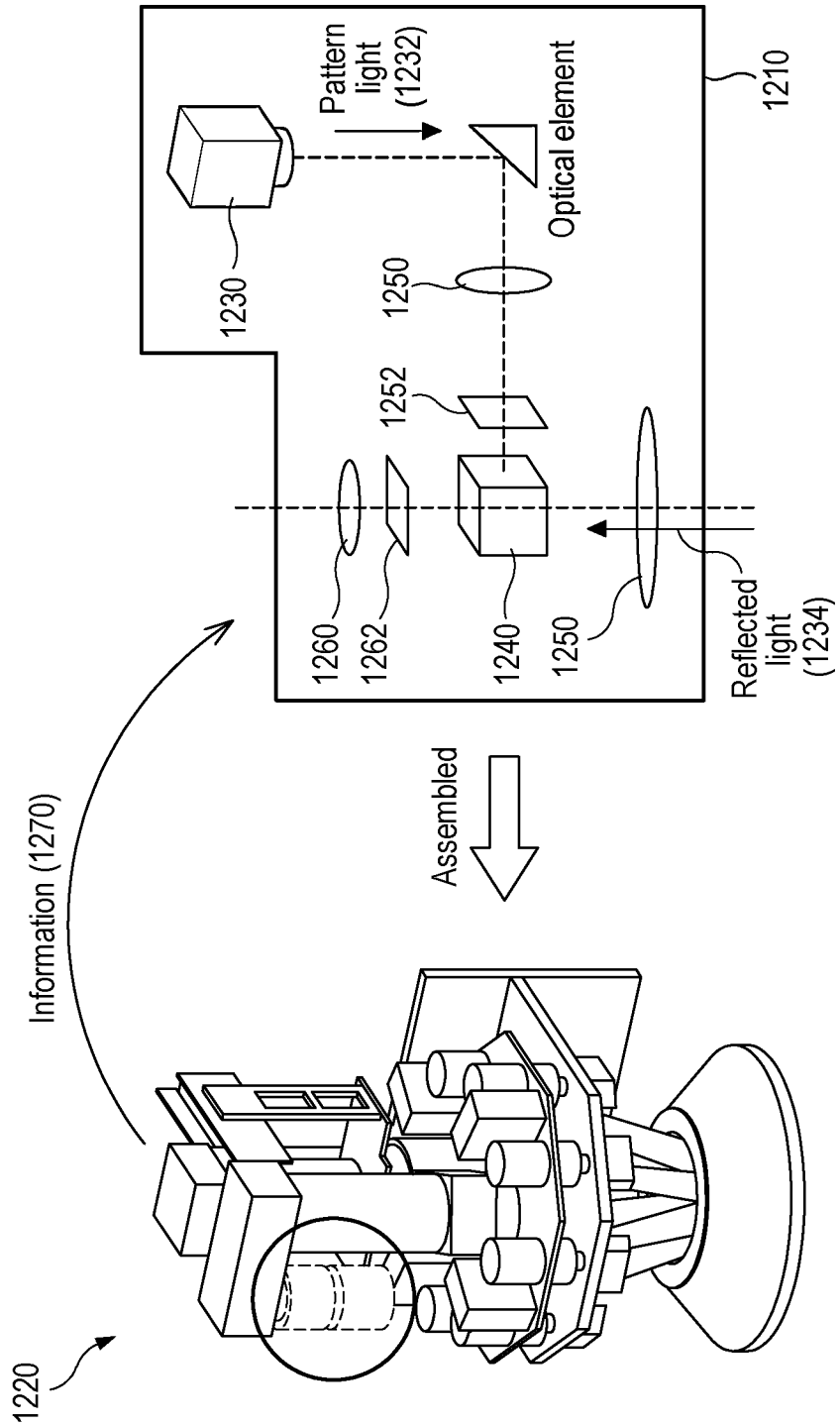
FIG. 12 is a diagram illustrating an apparatus 1210 according to an embodiment of the present disclosure.

FIG. 12 is a diagram illustrating an apparatus 1210 according to an embodiment of the present disclosure. The apparatus 1210 is an apparatus corresponding to the above-described DFM part 120 and may determine the angle of the upper surface of the object located on the reference plane R. At least one component in the apparatus 1210 may be implemented as a removable device and may be coupled to an apparatus 1220. If the apparatus 1210 is not coupled, a coaxial 2D light source may be attached to the location where the apparatus 1210 was coupled. The coaxial 2D light source may irradiate at least one monochromatic light selected from a red light, a green light, a blue light and a white light. The coaxial 2D light source may be implemented through an optical element such as an LED or the like. By irradiating a 2D monochromatic illumination light through the detachable apparatus 1210 or the coaxial 2D light source, a more accurate 3D shape restoration may be performed according to an object.

The apparatus 1220 may be an apparatus including the pattern light irradiation part 110, the measurement part 130 and/or the illumination light irradiation part 140 described above. The apparatus 1220 may determine the above-described primary three-dimensional shape of the object on the reference plane R. When the apparatus 1210 is coupled to the apparatus 1220, there may be provided a configuration similar to that of the apparatus 100 described above. The combination of the apparatus 1210 and the apparatus 1220 may determine the above-described second (final) three-dimensional shape of the object in the same manner as performed by the apparatus 100. That is, the apparatus 1220 may determine a primary three-dimensional shape of the object by performing an inspection using pattern lights and/or an inspection using illumination lights, and the apparatus 1210 may determine an angle of the upper surface of the object. A secondary three-dimensional shape may be determined by correcting the primary three-dimensional shape of the object using the angle of the upper surface. In some embodiments, the process of correcting the primary three-dimensional shape of the object and determining the secondary three-dimensional shape may be performed by the apparatus 1210 or the apparatus 1220.

Specifically, the pattern light source 1230 of the apparatus 1210 may sequentially irradiate one or more pattern lights 1232. The pattern light source 1230 and the patterned lights 1232 may correspond to the pattern light source 230 and the pattern lights 232, respectively. Similarly to the pattern lights 232, the respective pattern lights 1232 may have the same one phase range. In addition, the respective pattern lights 1232 may be generated by phase-shifting the pattern lights having patterns in a w-axis direction or a v-axis direction by an integer multiple of a preset phase interval.

The beam splitter 1240 and the one or more lenses 1250 may change the optical paths of the one or more pattern lights 1232. The beam splitter 1240 and the one or more lenses 1250 may correspond to the beam splitter 240 and the one or more lenses 250, respectively. Similarly to the beam splitter 240 and the one or more lenses 250 described above, the beam splitter 1240 and the one or more lenses 1250 may change the optical paths of the one or more pattern lights 1232 so that the lights corresponding to the respective phases in the above-described phase range can reach the partial region A of the upper surface of the object in a dispersed manner. In one embodiment, other necessary optical elements (e.g., mirrors) may be additionally used to change the optical paths. In one embodiment, the pattern lights 1232 may pass through the iris 1252 before being inputted to the beam splitter 1240.

The one or more pattern lights 1232 may be reflected from the partial region A of the object. The lights (hereinafter referred to as reflected lights 1234) formed by the reflection of the pattern lights 1232 may pass through the beam splitter 1240, the iris 1262, other lenses 1260 and the like, and may be inputted to the image sensor of the apparatus 1220. This image sensor may correspond to the above-described image sensor 220.

The apparatus 1210 may obtain information 1270 about the one or more reflected lights 1234 from the apparatus 1220. The apparatus 1210 may determine an angle of the upper surface of the object with respect to the reference plane R based on the information 1270. The process of determining the angle of the upper surface may be the same as the process described above in respect of the apparatus 100. In one embodiment, the information 1270 may include information indicating a light amount value of each of the one or more reflected lights 1234.

As described above, the apparatus 1220 is an apparatus including the pattern light irradiation part 110, the measurement part 130 and/or the illumination light irradiation part 140 described above, and may perform an inspection using the pattern lights and/or the illumination lights. Specifically, the apparatus 1220 may include one or more pattern light sources (corresponding to the pattern light sources 210), an image sensor (corresponding to the image sensor 220), and/or a processor (corresponding to the processor 310). The pattern light sources may irradiate one or more pattern lights (corresponding to the pattern lights 212) to the object. The image sensor may capture the reflected lights (corresponding to the reflected lights 214) of the pattern lights (corresponding to the pattern lights 212). The image sensor may also capture the reflected lights (corresponding to the reflected lights 234) of the pattern lights 1232. The processor may determine a primary three-dimensional shape of the object based on the captured reflected lights, and may transmit information indicating the determined primary three-dimensional shape to the apparatus 1210.

Figure 13:
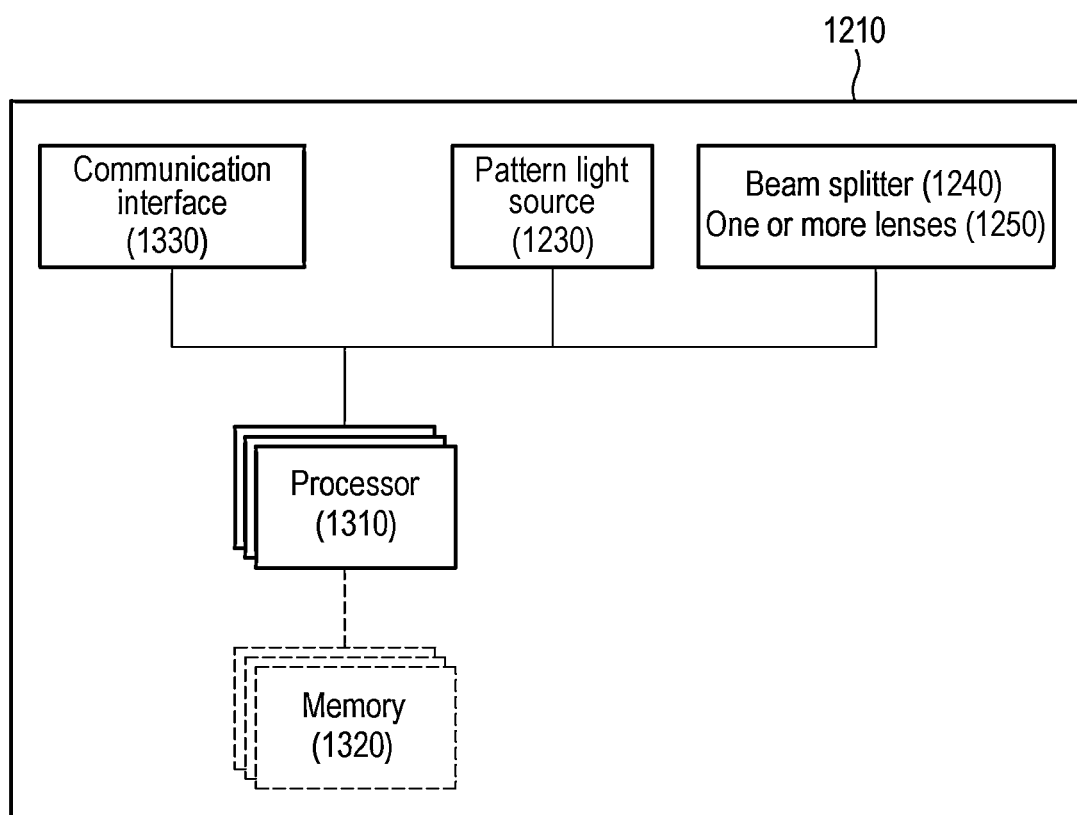
FIG. 13 is a block diagram of the apparatus 1210 according to an embodiment of the present disclosure.

FIG. 13 is a block diagram of an apparatus 1210 according to an embodiment of the present disclosure. In one embodiment, the apparatus 1210 may include a pattern light source 1230, a beam splitter 1240, one or more lenses 1250, a communication interface 1330, one or more processors 1310 and/or one or more memories 1320. In one embodiment, at least one of these components of the apparatus 1210 may be omitted, or other components may be added to the apparatus 1210. In one embodiment, additionally or alternatively, some components may be integrally implemented, or may be implemented as a singular entity or plural entities. In one embodiment, at least some of the internal and external components of the apparatus 1210 may be connected to each other through a bus, a general-purpose input/output (GPIO) device, a serial peripheral interface (SPI), a mobile industry processor interface (MIPI), or the like to transmit and receive data and/or signals.

The pattern light source 1230, the beam splitter 1240 and the one or more lenses 1250 may correspond to the pattern light source 230, the beam splitter 240 and the one or more lenses 250 described above, and may perform the same and similar operations to perform an inspection according to deflectometry.

The communication interface 1330 may be implemented in a manner similar to the communication interface of the apparatus 100 described above. The communication interface 1330 may be controlled by the processor 1310 to communicate with the apparatus 1220. For example, the communication interface 1330 may obtain information 1270 about one or more reflected lights 1234 from the apparatus 1220.

The processor 1310 may be implemented in a manner similar to the processor 310 of the apparatus 100 described above. The processor 1310 may control the communication interface 1330 to obtain information 1270 on one or more reflected lights 1234 and may determine the angle of the upper surface of the object with respect to the reference plane R based on the information 1270.

In one embodiment, the processor 1310 of the apparatus 1210 may derive a phase value of each of the one or more reflected lights 1234 from a light amount value of each of the one or more reflected lights 1234. The processor 1310 may determine an angle of the upper surface of the object with respect to the reference plane R based on the derived phase value. This process may correspond to the process in which the above-described processor 310 derives the phase value from the light amount value of each of the reflected lights 234 and determines the angle of the upper surface from the phase value. In one embodiment, the memory 1320 may store reference information similarly to the memory 320, and the processor 1310 may determine the angle of the upper surface based on the phase value of each of the reflected lights 1234 and the reference information.

In one embodiment, the apparatus 1210 may transmit information indicating the derived angle of the upper surface to the apparatus 1220 so that the apparatus 1220 can determine a secondary three-dimensional shape. Specifically, the processor 1310 may control the communication interface 1330 to transmit information indicating the derived angle of the upper surface to the apparatus 1220. As described above, the apparatus 1220 may determine the primary three-dimensional shape of the object through an inspection using pattern lights and/or illumination lights. The information indicating the angle of the upper surface may be used by the apparatus 1220 to determine a secondary three-dimensional shape by correcting the upper surface of the object indicated by the primary three-dimensional shape.

In one embodiment, the apparatus 1210 may obtain information indicating the primary three-dimensional shape of the object from the apparatus 1220 and may directly determine a secondary three-dimensional shape using the information. Specifically, the processor 1310 may control the communication interface 1330 to obtain information about the primary three-dimensional shape of the object determined by the apparatus 1220. The processor 1310 may determine a secondary three-dimensional shape by correcting the upper surface of the object indicated by the primary three-dimensional shape based on the determined angle of the upper surface.

In one embodiment, the pattern light source 1230 may further irradiate a white light, and the beam splitter 1240 and the one or more lenses 1250 may change the optical path of the white light so that the white light arrives at the upper surface of the object. This may correspond to irradiating the white light 1110 by the pattern light source 230 of the apparatus 100 described above. As described above, the white light may be reflected from the upper surface of the object. The apparatus 1220 may capture the reflected light and may determine the primary three-dimensional shape of the object based on a change in the light amount of the reflected light from the white light.

In one embodiment, the processor 1310 may control the communication interface 1330 to obtain information indicating the reflectance of the upper surface of the object from the apparatus 1220. When the reflectance of the upper surface is equal to or greater than a preset reference reflectance, the processor 1310 may control the pattern light source 1230 to sequentially irradiate one or more pattern lights 1232. This may correspond to controlling the pattern light source 230 based on the reference reflectance by the processor 310 of the apparatus 100 described above.

Figure 14:
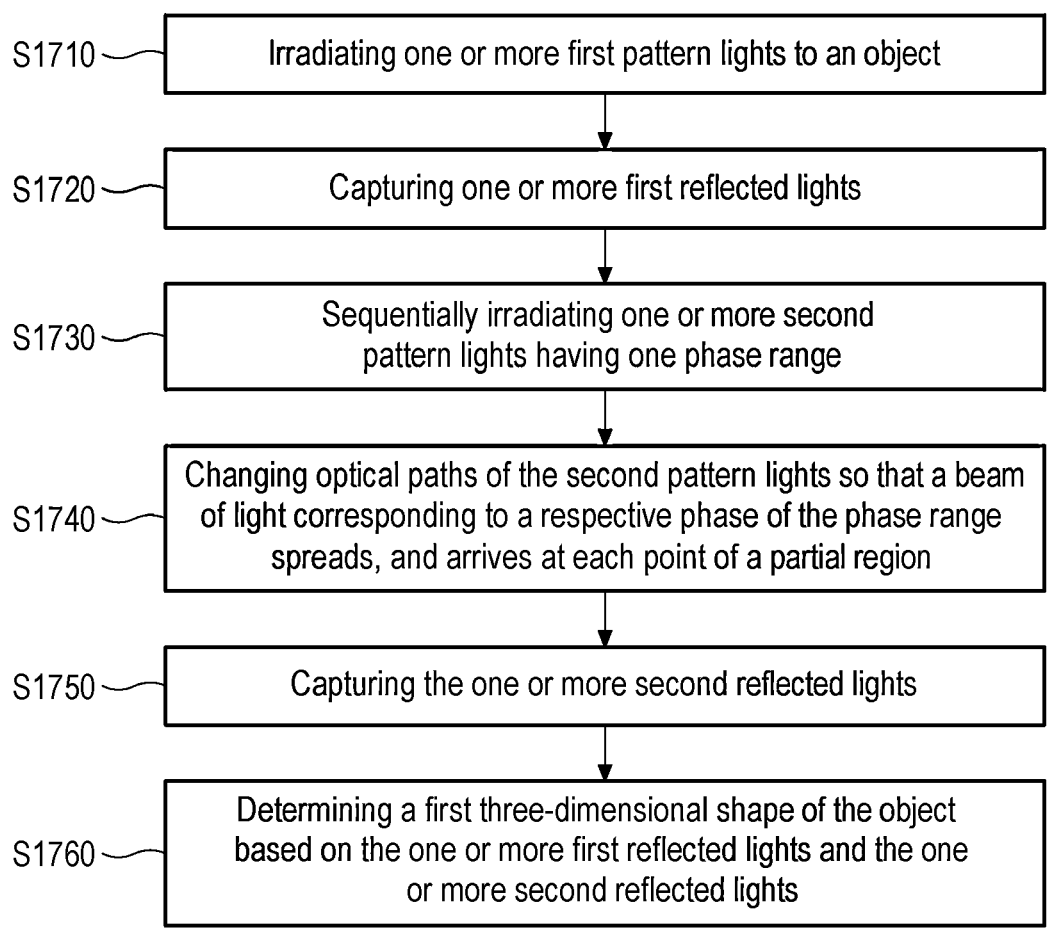
FIG. 14 is a diagram illustrating one example of a method 1700 for determining a three-dimensional shape of an object, which may be performed by the apparatus 100 according to the present disclosure.
Figure 15:
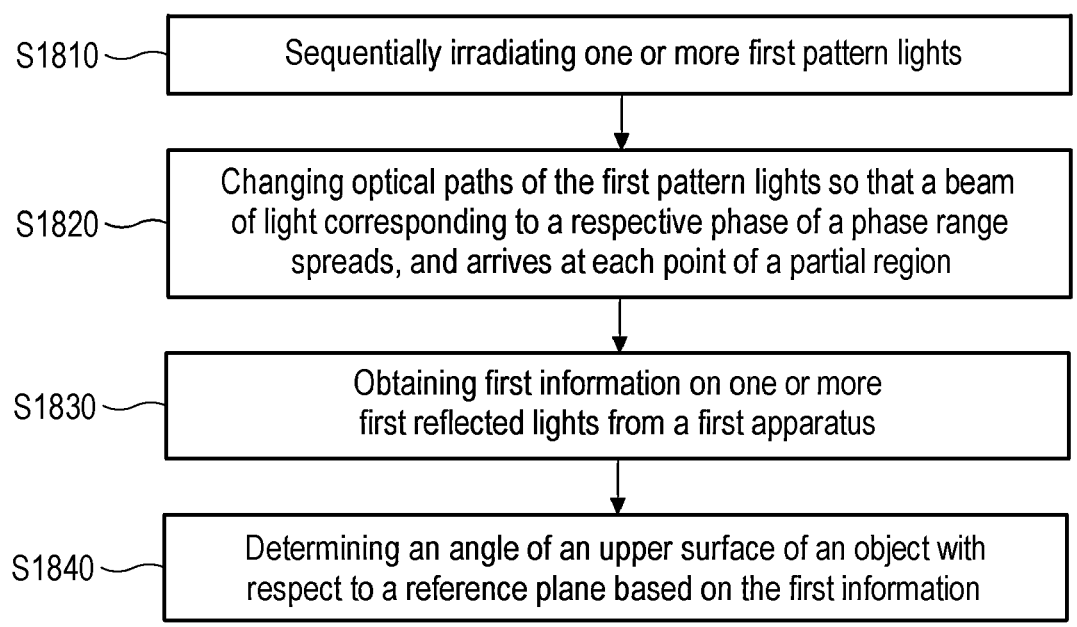
FIG. 15 is a diagram illustrating an example of a method 1800 of determining an angle of an upper surface of an object, which may be performed by the apparatus 1210 according to the present disclosure.

FIGS. 14 and 15 are diagrams showing examples of the methods that can be performed by the apparatuses 100 and 1210 according to the present disclosure. The methods according to the present disclosure may be computer-implemented methods. Although the respective steps of the method or algorithm according to the present disclosure have been described in a sequential order in the illustrated flowchart, the respective steps may be performed in an order that can be arbitrarily combined by the present disclosure, in addition to being performed sequentially. The description in accordance with this flowchart does not exclude making changes or modifications to the method or algorithm, and does not imply that any step is necessary or desirable. In one embodiment, at least some of the steps may be performed in parallel, repetitively or heuristically. In one embodiment, at least some of the steps may be omitted, or other steps may be added.

FIG. 14 is a diagram illustrating one example of a method 1700 for determining a three-dimensional shape of an object, which may be performed by the apparatus 100 according to the present disclosure. The apparatus 100 according to the present disclosure may perform the method 1700 in determining a first three-dimensional shape (e.g., the secondary three-dimensional shape) of the object located on the reference plane. The method 1700 according to an embodiment of the present disclosure may include: step S1710 of irradiating one or more first pattern lights to an object; step S1720 of capturing one or more first reflected lights; step S1730 of sequentially irradiating one or more second pattern lights having one phase range; step S1740 of changing optical paths of the second pattern lights so that a beam of light corresponding to a respective phase of the phase range spreads, and arrives at each point of a partial region; step S1750 of capturing the one or more second reflected lights; and/or step S1760 of determining a first three-dimensional shape of the object based on the one or more first reflected lights and the one or more second reflected lights.

In step S1710, one or more first light sources (e.g., the pattern light sources 210) of the apparatus 100 may irradiate one or more first pattern lights (e.g., the pattern lights 212) to the object. In step S1720, the image sensor 220 may capture one or more first reflected lights (e.g., the reflected lights 214) generated by reflecting the one or more first pattern lights (e.g., the pattern lights 212) from the object.

In step S1730, the second light source (e.g., the pattern light source 230) may sequentially irradiate one or more second pattern lights (e.g., the pattern lights 232) having one phase range. In step S1740, the beam splitter 240 and the one or more lenses 250 may change optical paths of the one or more second pattern lights (e.g., the pattern lights 232) so that a beam of light corresponding to a respective phase of the phase range spreads, and arrives at each point of a partial region A of the upper surface of the object. In step S1750, the image sensor 220 may capture one or more second reflected lights (e.g., the reflected lights 234) generated by reflecting the one or more second pattern lights (e.g., the pattern lights 232) from the partial region A.

In step S1760, the processor 310 may determine a first three-dimensional shape (e.g., a secondary three-dimensional shape) of the object based on the one or more first reflected lights (e.g., the reflected lights 214) and the one or more second reflected lights (e.g., the reflected lights 234).

In one embodiment, step S1760 of determining the first three-dimensional shape (e.g., the secondary three-dimensional shape) (S1760) may include determining, by the processor 310, a second three-dimensional shape (e.g., the primary three-dimensional shape) of the object based on each of the phase changes of the one or more first reflected lights (e.g., the reflected lights 214) from the one or more first pattern lights (e.g., the pattern lights 212). In addition, step S1760 may include deriving, by the processor 310, a phase value of each of the one or more second reflected lights (e.g., the reflected lights 234) from the each light amount value of the one or more second reflected lights (e.g., the reflected lights 234). Moreover, step S1760 may include determining, by the processor 310, a first three-dimensional shape (e.g., the secondary three-dimensional shape) of the object by correcting the upper surface of the object indicated by the second three-dimensional shape (e.g., the primary three-dimensional shape) based on the angle of the upper surface.

In one embodiment, determining the angle of the upper surface may include determining, by the processor 310, the angle of the upper surface with respect to the reference plane R based on the phase value and the reference information.

In one embodiment, the apparatus 100 may further include one or more third light sources (e.g., illumination light sources 1010). In addition, determining the second three-dimensional shape (e.g., the primary three-dimensional shape) of the object may include determining, by the processor 310, a second three-dimensional shape (e.g., a primary three-dimensional shape) of the object based on each of changes in the phases of the one or more first reflected lights (e.g., the reflected lights 214) from the one or more first pattern lights (e.g., the pattern lights 212) and each of changes in the light amounts of the one or more third reflected lights (e.g., the reflected lights 1030) from the illumination lights 1020 according to one or more wavelengths.

In one embodiment, the method 1700 may further include: irradiating a white light 1110 by a second light source (e.g., the pattern light source 230); changing an optical path of the white light 1110 by the beam splitter 240 and the one or more lenses 250 so that the white light 1110 arrives at the upper surface of the object; and/or capturing, by the image sensor 220, a fourth reflected light (e.g., the reflected light 1120) generated by reflecting the white light 1110 from the upper surface of the object.

In one embodiment, determining the second three-dimensional shape (e.g., the primary three-dimensional shape) may include determining, by the processor 310, the second three-dimensional shape (e.g., the primary three-dimensional shape) of the object based on each of changes in the phases of the one or more first reflected lights (e.g., the reflected lights 214) from the one or more first pattern lights (e.g., the pattern lights 212) and a change in the light amount of the fourth reflected light (e.g., the reflected light 1120) from the white light 1110.

In one embodiment, the method 1700 may further include: deriving, by the processor 310, a reflectance of the upper surface of the object based on a change in the light amount of the fourth reflected light (e.g., the reflected light 1120) from the white light 1110; and/or controlling a second light source (e.g., the pattern light source 230) to sequentially irradiate one or more second pattern lights (e.g., the pattern lights 232) when the reflectance of the upper surface of the object is equal to or greater than a preset reference reflectance.

FIG. 15 is a diagram illustrating an example of a method 1800 for determining an angle of an upper surface of an object, which may be performed by the apparatus 1210 according to the present disclosure. The method 1800 according to an embodiment of the present disclosure may include: step S1810 of sequentially irradiating one or more first pattern lights; step S1820 of changing optical paths of the first pattern lights so that a beam of light corresponding to a respective phase of a phase range spreads, and arrives at each point of a partial region; step S1830 of obtaining first information about one or more first reflected lights from a first apparatus; and/or step S1840 of determining an angle of an upper surface of an object with respect to a reference plane based on the first information.

In step S1810, the first light source (e.g., the pattern light source 1230) may sequentially irradiate one or more first pattern lights (e.g., the pattern lights 1232) having one phase range. In step S1820, a beam splitter (e.g., the beam splitter 1240) and one or more lenses (e.g., the lens 1250) may change optical paths of the one or more first pattern lights (e.g., the pattern lights 1232) so that a beam of light corresponding to a respective phase in the phase range spreads, and arrives at each point of a partial region A of the upper surface.

In step S1830, a first processor (e.g., the processor 1310) may obtain, from a first apparatus (e.g., the apparatus 1220), first information (e.g., the information 1270) about one or more first reflected lights (e.g., the reflected lights 1234) generated by reflecting the one or more first pattern lights (e.g., the pattern lights 1232) from the partial region A.

In step S1840, the first processor (e.g., the processor 1310) may determine an angle of the upper surface with respect to the reference plane R based on the first information (e.g., the information 1270).

In one embodiment, determining the angle of the upper surface may include deriving, by the first processor (e.g., the processor 1310), a phase value of each of the one or more first reflected lights (e.g., the reflected lights 1234) from the each light amount value of the one or more first reflected lights (e.g., the reflected lights 1234); and/or determining, by the first processor (e.g., the processor 1310), the angle of the upper surface with respect to the reference plane R based on the derived phase value.

In one embodiment, the method 1800 may further include: transmitting, by the first processor (e.g., the processor 1310), second information indicating the angle of the upper surface to the first apparatus (e.g., the apparatus 1220). The second information may be used by the first apparatus (e.g., the apparatus 1220) to determine a second three-dimensional shape (e.g., the primary three-dimensional shape) of the object by correcting the upper surface of the object indicated by the first three-dimensional shape (e.g., the primary three-dimensional shape).

In one embodiment, the method 1800 may further include: obtaining, by the first processor (e.g., the processor 1310), third information indicating a first three-dimensional shape (e.g., the primary three-dimensional shape) of the object from the first apparatus (e.g., the apparatus 1220); and/or determining, by the first processor (e.g., the processor 1310), a second three-dimensional shape (e.g., the secondary three-dimensional shape) of the object by correcting the upper surface of the object indicated by the first three-dimensional shape (e.g., the primary three-dimensional shape) based on the angle of the upper surface.

In one embodiment, the method 1800 may further include: irradiating, by a first light source (e.g., the pattern light source 1230), a white light; and/or changing, by a beam splitter (e.g., the beam splitter 1240) and one or more lenses (e.g., the lens 1250), an optical path of the white light so that the white light arrives at the upper surface of the object.

In one embodiment, the method 1800 may further include: obtaining, by the first processor (e.g., the processor 1310), fourth information indicating a reflectance of the upper surface from the first apparatus (e.g., the apparatus 1220) by controlling a communication interface 1330; and/or controlling a first light source (e.g., the pattern light source 1230) to sequentially irradiate one or more first pattern lights (e.g., the pattern lights 1232) when the reflectance of the upper surface is equal to or greater than a preset reference reflectance.

According to various embodiments of the present disclosure, the determination of the three-dimensional shape of the object can be improved by efficiently measuring the tilt of the upper surface of the object using the light amount of the reflected light reflected from the object (e.g., a device). Whether the entire substrate mounting process is properly performed can be inspected through the three-dimensional shape of the object.

According to various embodiments of the present disclosure, the tilt of the object is not inspected based on the image formation position of the reflected light from the object. Therefore, it is possible to facilitate the downsizing of the inspection apparatus.

According to various embodiments of the present disclosure, the tilt of the object is not inspected based on the diffraction pattern formed in the air above the object. Therefore, it is possible to perform a noise-robust inspection.

Various embodiments of the present disclosure may be implemented as software recorded on a machine-readable recording medium. The software may be software for implementing the various embodiments of the present disclosure described above. The software may be inferred from various embodiments of the present disclosure by programmers in the art to which the present disclosure belongs. For example, the software may be instructions (e.g., code or code segments) or programs that can be read by a device. The device is a device capable of operating according to instructions called from a recording medium, and may be, for example, a computer. In one embodiment, the device may be the apparatuses 100 and 1210 according to embodiments of the present disclosure. In one embodiment, the processor of the device may execute the called instructions so that components of the device can perform a function corresponding to the instructions. In one embodiment, the processor may be one or more processors according to the embodiments of the present disclosure. The recording medium may refer to any type of device-readable recording medium in which data is stored. The recording medium may include, for example, a ROM, a RAM, a CD-ROM, a magnetic tape, a floppy disk, an optical data storage device, and the like. In one embodiment, the recording medium may be one or more memories. In one embodiment, the recording medium may be implemented in a distributed form in computer systems connected by a network. The software may be distributed, stored and executed in a computer system or the like. The recording medium may be a non-transitory recording medium. The non-transitory recording medium refers to a tangible medium irrespective of whether data is stored semi-permanently or temporarily, and does not include a signal propagating in a transitory manner.

Although the technical content of the present disclosure has been described by the examples described in some embodiments and illustrated in the accompanying drawings, it should be noted that various substitutions, modifications, and changes can be made without departing from the scope of the present disclosure which can be understood by those having ordinary skill in the art to which the present disclosure pertains. In addition, it should be noted that such substitutions, modifications and changes are intended to fall within the scope of the appended claims.

What is claimed is:

1. A detachable angle determination device coupled to a shape determination device that determines a first three-dimensional shape of an object located on a reference plane, and configured to determine an angle of an upper surface of the object with respect to the reference plane, the detachable angle determination device comprising:
   a first light source configured to sequentially irradiate one or more first pattern lights having one phase range;
   a beam splitter and one or more lenses configured to change optical paths of the one or more first pattern lights so that a beam of light corresponding to a respective phase of the phase range spreads, and arrives at each point of a partial region of the upper surface of the object;
   a communication interface configured to communicate with the shape determination device; and
   a first processor that is electrically connected to the first light source and the communication interface, and that is configured to:
      obtain, from an image sensor of the shape determination device, first information on one or more first reflected lights generated by reflecting the one or more first pattern lights from the partial region;
      determine the angle of the upper surface with respect to the reference plane based on the first information;
      control the communication interface to obtain third information indicating the first three-dimensional shape of the object determined based on each of phase changes of one or more second reflected lights from one or more second pattern lights from the shape determination device; and
      generate the second information indicating the angle of the upper surface with respect to the reference plane based on the first information indicating each light amount
   value of the one or more first reflected lights, and
   wherein the second information is used to determine a second three-dimensional shape of the object by correcting the upper surface of the object indicated by the first three-dimensional shape.

2. The detachable angle determination device of claim 1, further comprising:
   a memory configured to store reference information indicating a relationship between the angle of the upper surface with respect to the reference plane and the each light amount value of the one or more first reflected lights,
   wherein the first processor is further configured to determine the angle of the upper surface of the object with respect to the reference plane based on the each light amount value of the one or more first reflected lights and the reference information.

3. The detachable angle determination device of claim 1, wherein the first processor is further configured to control the communication interface to transmit the second information.

4. The detachable angle determination device of claim 1, wherein the first processor is further configured to
determine the second three-dimensional shape of the object by correcting the upper surface of the object indicated by the first three-dimensional shape based on the second information.

5. The detachable angle determination device of claim 1, wherein the first light source is further configured to irradiate a monochromatic light, and
wherein the beam splitter and the one or more lenses are further configured to change an optical path of the monochromatic light so that the monochromatic light arrives at the upper surface.

6. The detachable angle determination device of claim 5, wherein the first processor is further configured to:
control the communication interface to obtain fourth information indicating a reflectance of the upper surface from the shape determination device; and
when the reflectance of the upper surface is equal to or greater than a preset reference reflectance, control the first light source so as to sequentially irradiate the one or more first pattern lights.

7. The detachable angle determination device of claim 1, wherein each of the one or more first pattern lights is a pattern light generated by phase-shifting a pattern light having a pattern in a first direction or in a second direction perpendicular to the first direction by an integer multiple of a preset phase interval.

8. The detachable angle determination device of claim 1, wherein the shape determination device includes:
one or more second light sources configured to irradiate one or more second pattern lights to the object;
an image sensor configured to capture the one or more first reflected lights and one or more second reflected lights generated by reflecting the one or more second pattern lights from the object; and
a second processor configured to:
determine the first three-dimensional shape of the object based on the one or more first reflected lights and the one or more second reflected lights; and
transmit third information indicating the first three-dimensional shape to the detachable angle determination device.

9. A method for determining an angle of an upper surface of an object with respect to a reference plane, which is performed by a detachable angle determination device coupled to a shape determination device that determines a first three-dimensional shape of the object located on the reference plane, comprising:
sequentially irradiating, by a first light source, one or more first pattern lights having one phase range;
changing, by a beam splitter and one or more lenses, optical paths of the one or more first pattern lights so that a beam of light corresponding to a respective phase of the phase range spreads, and arrives at each point of a partial region of the upper surface of the object;
obtaining, by a first processor, from an image sensor of the shape determination device, first information on one or more first reflected lights generated by reflecting the one or more first pattern lights from the partial region;
determining, by the first processor, the angle of the upper surface with respect to the reference plane based on the first information,
obtaining, by the communication interface, third information indicating the first three-dimensional shape of the object determined based on each of phase changes of one or more second reflected lights from one or more second pattern lights from the shape determination device; and
generating, by the first processor, the second information indicating the angle of the upper surface with respect to the reference plane based on the first information indicating each light amount value of the one or more first reflected lights, and
wherein the second information is used to determine a second three-dimensional shape of the object by correcting the upper surface of the object indicated by the first three-dimensional shape.

10. The method of claim 9, further comprising:
transmitting, by the first processor, the second information.

11. The method of claim 9, further comprising:
determining, by the first processor, the second three-dimensional shape of the object by correcting the upper surface of the object indicated by the first three-dimensional shape based on the second information.

* * * * *